(12) United States Patent
Lee et al.

(10) Patent No.: US 7,407,842 B2
(45) Date of Patent: Aug. 5, 2008

(54) LIQUID CRYSTAL DISPLAY DEVICE AND METHOD OF FABRICATING THE SAME

(75) Inventors: Dai Yun Lee, Uiwang-si (KR); Yong In Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 30 days.

(21) Appl. No.: 11/270,583

(22) Filed: Nov. 10, 2005

(65) Prior Publication Data

US 2006/0102899 A1    May 18, 2006

(30) Foreign Application Priority Data

Nov. 12, 2004    (KR)    ...................... 10-2004-0092682

(51) Int. Cl.
*H01L 21/00*    (2006.01)

(52) U.S. Cl. ...................... 438/151; 438/164

(58) Field of Classification Search ................. 438/151, 438/164

See application file for complete search history.

(56) References Cited

U.S. PATENT DOCUMENTS

| | | | |
|---|---|---|---|
| 5,667,631 A * | 9/1997 | Holland et al. ................. | 216/13 |
| 6,048,783 A | 4/2000 | Kim et al. | |
| 6,069,387 A | 5/2000 | Gardner | |
| 6,091,120 A | 7/2000 | Yeom et al. | |
| 6,403,409 B1 | 6/2002 | You | |
| 6,617,203 B2 | 9/2003 | Kim et al. | |
| 6,624,473 B1 * | 9/2003 | Takehashi et al. ........... | 257/344 |
| 6,753,235 B2 | 6/2004 | So et al. | |
| 6,773,944 B2 | 8/2004 | Okamoto | |
| 6,933,989 B2 | 8/2005 | Oke et al. | |
| 7,256,060 B2 * | 8/2007 | Park ............................ | 438/30 |
| 2001/0003657 A1 | 6/2001 | Lee | |
| 2004/0087125 A1 * | 5/2004 | Monoe ........................ | 438/592 |
| 2005/0101044 A1 * | 5/2005 | Cho et al. .................... | 438/30 |
| 2005/0186698 A1 | 8/2005 | Ishida et al. | |
| 2005/0285194 A1 * | 12/2005 | Lee et al. .................... | 257/347 |
| 2006/0017054 A1 * | 1/2006 | Ahn ........................... | 257/72 |

FOREIGN PATENT DOCUMENTS

| | | |
|---|---|---|
| KR | 10-19970008589 | 5/1997 |
| KR | 10-19970011966 | 8/1997 |
| KR | 10-0161461 | 8/1998 |
| KR | 10-0175408 | 11/1998 |
| KR | 10-0177785 | 11/1998 |

(Continued)

*Primary Examiner*—Lex Malsawma
(74) *Attorney, Agent, or Firm*—McKenna Long & Aldridge LLP

(57) ABSTRACT

Disclosed herein are a poly type thin film transistor substrate and a fabricating method thereof, which can reduce the number of processing steps without any process defects. The poly type thin film transistor substrate comprises forming transparent lower conductive layer and upper conductive layers on a substrate; forming a photo-resist pattern on the upper conductive layer; patterning the upper conductive layer by using the photo-resist pattern as a mask; ashing the photo-resist pattern so as to remain on the upper conductive layer; patterning the lower conductive layer by a dry etching method using the patterned upper conductive layer as a mask; and removing the remaining photo-resist pattern.

16 Claims, 34 Drawing Sheets

FOREIGN PATENT DOCUMENTS

| | | |
|---|---|---|
| KR | 10-0184509 | 12/1998 |
| KR | 10-0192593 | 1/1999 |
| KR | 10-20000025565 | 5/2000 |
| KR | 10-20000026894 | 5/2000 |
| KR | 10-20000026895 | 5/2000 |
| KR | 10-20000031451 | 6/2000 |
| KR | 10-20000041223 | 7/2000 |
| KR | 10-20000075031 | 12/2000 |
| KR | 10-20010019665 | 3/2001 |
| KR | 10-20010019668 | 3/2001 |
| KR | 10-0297706 | 5/2001 |
| KR | 10-2001-0054739 | 7/2001 |
| KR | 10-20010055071 | 7/2001 |
| KR | 10-20010056037 | 7/2001 |
| KR | 10-2001-0110917 | 12/2001 |
| KR | 10-20020009188 | 2/2002 |
| KR | 10-20020022258 | 3/2002 |
| KR | 10-20020071061 | 9/2002 |
| KR | 10-20020071062 | 9/2002 |
| KR | 10-20020074897 | 10/2002 |
| KR | 10-20020078116 | 10/2002 |
| KR | 10-20020079196 | 10/2002 |
| KR | 10-20020080202 | 10/2002 |
| KR | 10-20030006619 | 1/2003 |
| KR | 10-20030030286 | 4/2003 |

* cited by examiner

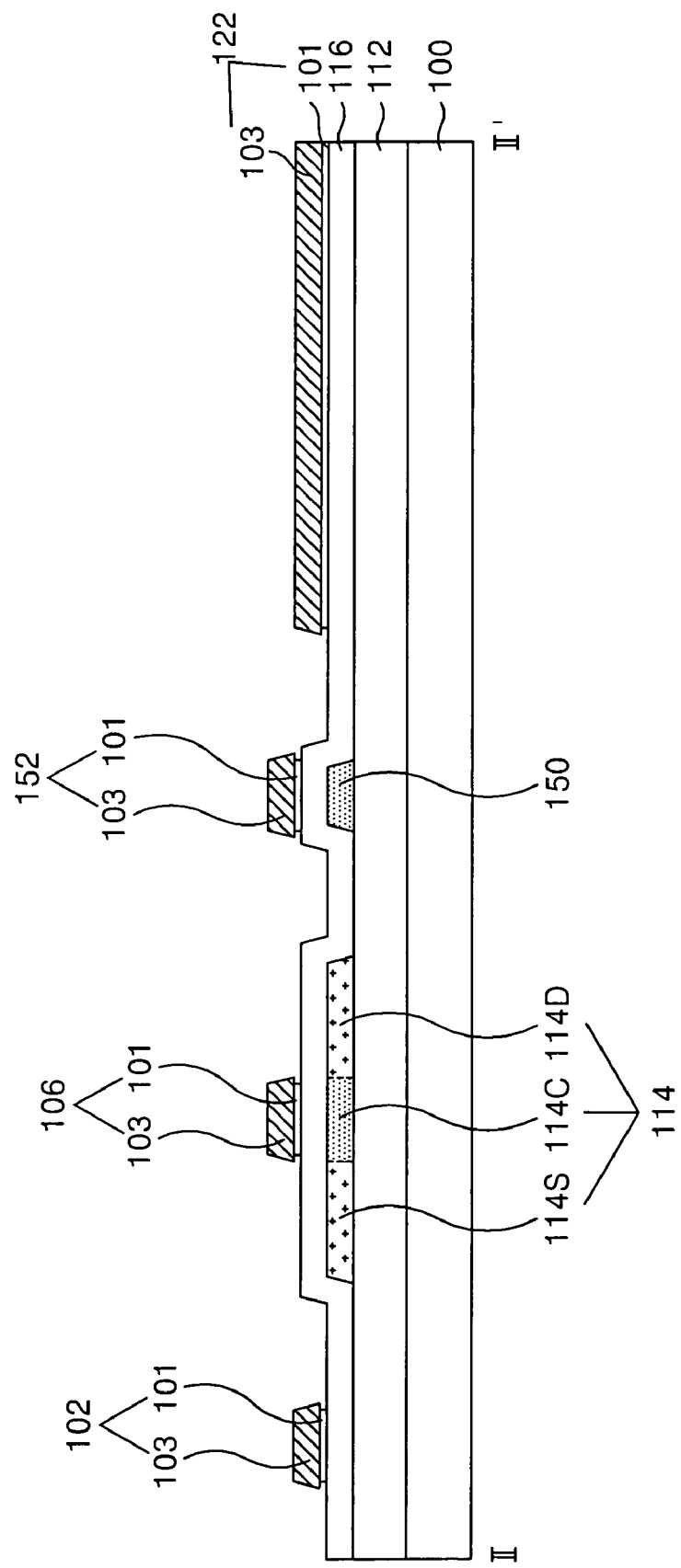

US 7,407,842 B2

LIQUID CRYSTAL DISPLAY DEVICE AND METHOD OF FABRICATING THE SAME

This application claims the benefit of the Korean Patent Application No. P2004-92682 filed on Nov. 12, 2004, which is hereby incorporated by reference for all purposes as if fully set forth herein.

BACKGROUND OF THE INVENTION

1. Field of the Invention

The present invention relates to a thin film transistor substrate of a liquid crystal display panel using polysilicon, and more particularly to a polysilicon thin film transistor substrate reduces the number of processing steps without any process defects, and a fabricating method thereof.

2. Discussion of the Related Art

Generally, a liquid crystal display LCD device has liquid crystal cells that are arranged in a matrix in a liquid crystal display panel to control the light transmittance of the liquid crystal in accordance with a video signal to display a picture.

A thin film transistor (hereinafter, referred to as "TFT") is used as a switch device to independently supply a video signal to each of the liquid crystal cells. Amorphous silicon or polysilicon is used as an active layer for the TFT. When using polysilicon, in which the charge mobility is approximately 100 times as fast as amorphous silicon, a drive circuit with a high response speed may be embedded in the liquid crystal display panel.

The polysilicon liquid crystal display panel includes a TFT substrate, in which the drive circuit is formed together with the TFT, and a color filter substrate, in which the color filter is formed, with liquid crystal therebetween.

FIG. 1 is a plan view illustrating part of a polysilicon TFT substrate, and FIG. 2 is a sectional diagram illustrating the TFT substrate shown in FIG. 1, taken along the line I-I'.

The TFT substrate shown in FIGS. 1 and 2 includes a TFT 30 connected to a gate line 2 and a data line 4, and a pixel electrode 22 connected to the TFT 30. The TFT 30 is formed as an N-type or P-type, but the case of being formed as the N-type is only explained below.

The TFT 30 includes a gate electrode 6 connected to the gate line 2, a source electrode included as part of the data line 4, and a drain electrode 10 connected to the pixel electrode 22 through a pixel contact hole 20 penetrating a passivation film 18. The gate electrode 6 overlaps a channel area 14C of an active layer 14, which is formed on a buffer film 12, with a gate insulating film 16 therebetween. The source electrode and the drain electrode 10 are formed with an interlayer insulating film 26 between the gate electrode 6 and the source and drain electrodes. And the source electrode and the drain electrode 10 are respectively connected to a source area 14S and a drain area 14D of the active layer 14, into which n+ impurities are injected, through a source contact hole 24S and a drain contact hole 24D which penetrate the interlayer insulating film 26 and the gate insulating film 16.

The polysilicon TFT substrate is formed using six mask processes, as in FIGS. 3A to 3F.

Referring to FIG. 3A, a buffer film 12 is formed on a lower substrate 1, and the active layer 14 is formed thereon by a first mask process.

An amorphous silicon is deposited on the buffer film 12 and crystallized by a laser to produce polysilicon, and then the polysilicon is patterned by a photolithography process and an etching process using a first mask, thereby forming the active layer 14.

Referring to FIG. 3B, the gate insulating film 16 is formed on the buffer film 12 where the active layer 14 is formed, and the gate line 2 and the gate electrode 6 are formed thereon by a second mask process.

Next, N+ impurities are injected into a non-overlapping area of the active layer 14 using the gate electrode 6 as a mask, thereby forming the source area 14S and the drain area 14D of the active layer 14.

Referring to FIG. 3C, the interlayer insulating film 26 is formed on the gate insulating film 16 where the gate line 2 and the gate electrode 6 are formed, and the source and drain contact holes 24S, 24D penetrating the interlayer insulating film 26 and the gate insulating film 16 are formed by a third mask.

Referring to FIG. 3D, the data line 4 having the source electrode and the drain electrode 10 are formed on the interlayer insulating film 26 by a fourth mask process.

Referring to FIG. 3E, the passivation film 18, is formed on the interlayer insulating film 26 where the data line 4 and the drain electrode 10 are formed, and a pixel contact hole 20 penetrating the passivation film 18 to expose the drain electrode 10 is formed by a fifth mask process.

Referring to FIG. 3F, a transparent pixel electrode 22 is formed on the passivation film 18 by a sixth mask process.

In this way, the related art polysilicon TFT substrate is formed by the six mask processes, thus its fabricating processes are complicated. This is because one mask process includes many processes like a thin film deposition process, a cleaning process, a photolithography process, an etching process, a photo-resist peeling process, an inspection process, and so on. Accordingly, in order to reduce cost, a method is required so that the number of mask processes of the polysilicon TFT substrate are reduced without defect.

SUMMARY OF THE INVENTION

Accordingly, the present invention is directed to a liquid crystal display device and method of fabricating the same that substantially obviates one or more of the problems due to limitations and disadvantages of the related art.

An advantage of the present invention is to provide a liquid crystal display device that is adaptive for reducing the number of processes without any process defect, and a fabricating method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device, including: a gate line with a double conductive layer structure on a substrate; a data line crossing the gate line with an interlayer insulating film in between to define a pixel area; a pixel electrode formed of the double conductive layer structure in the pixel area and a lower conductive layer of the double conductive layer is exposed through a transmission hole; and a thin film transistor having a gate electrode with the double conductive layer structure connected to the gate line, a source electrode connected to the data line, a drain electrode connected to the pixel electrode, and a polysilicon active layer forming a channel between the source electrode and the drain electrode, wherein the double conductive layer is formed to have an edge of the lower conductive layer substantially aligned with an edge of an upper conductive layer or where the lower edge is located outside the upper edge.

In another aspect of the present invention, a method of fabricating a liquid crystal display device, including: forming transparent lower and upper conductive layers on a substrate; forming a photo-resist pattern on the upper conductive layer; patterning the upper conductive layer by using the photo-resist pattern as a mask; patterning the upper conductive layer by using the photo-resist pattern as a mask; ashing the photo-resist pattern so as to remain on the upper conductive layer; patterning the lower conductive layer by a dry etching method using the patterned upper conductive layer as a mask; and removing the remaining photo-resist pattern.

In another aspect of the present invention, a method of fabricating a liquid crystal display device, including: forming a buffer film on a substrate; forming a polysilicon active layer on the buffer film using a first mask; forming a gate insulating film on the active layer; forming a double conductive layer on the gate insulating film; forming a gate line, a gate electrode, and a pixel electrode by patterning the double conductive layer using a second mask so that the line width of a lower conductive layer is equal to or wider than the line width of an upper conductive layer; forming an interlayer insulating film on the patterned double conductive layer; forming source and drain contact holes exposing source and drain areas of the active layer and a transmission hole exposing the pixel electrode using a third mask; and forming a data line crossing the gate line and source and drain electrodes connected to the source and drain areas of the active layer on the interlayer insulating film using a fourth mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 6A to 6D are sectional diagrams for explaining a fabricating method of the thin film transistor substrate shown in FIG. 5 step by step;

Figure 1:
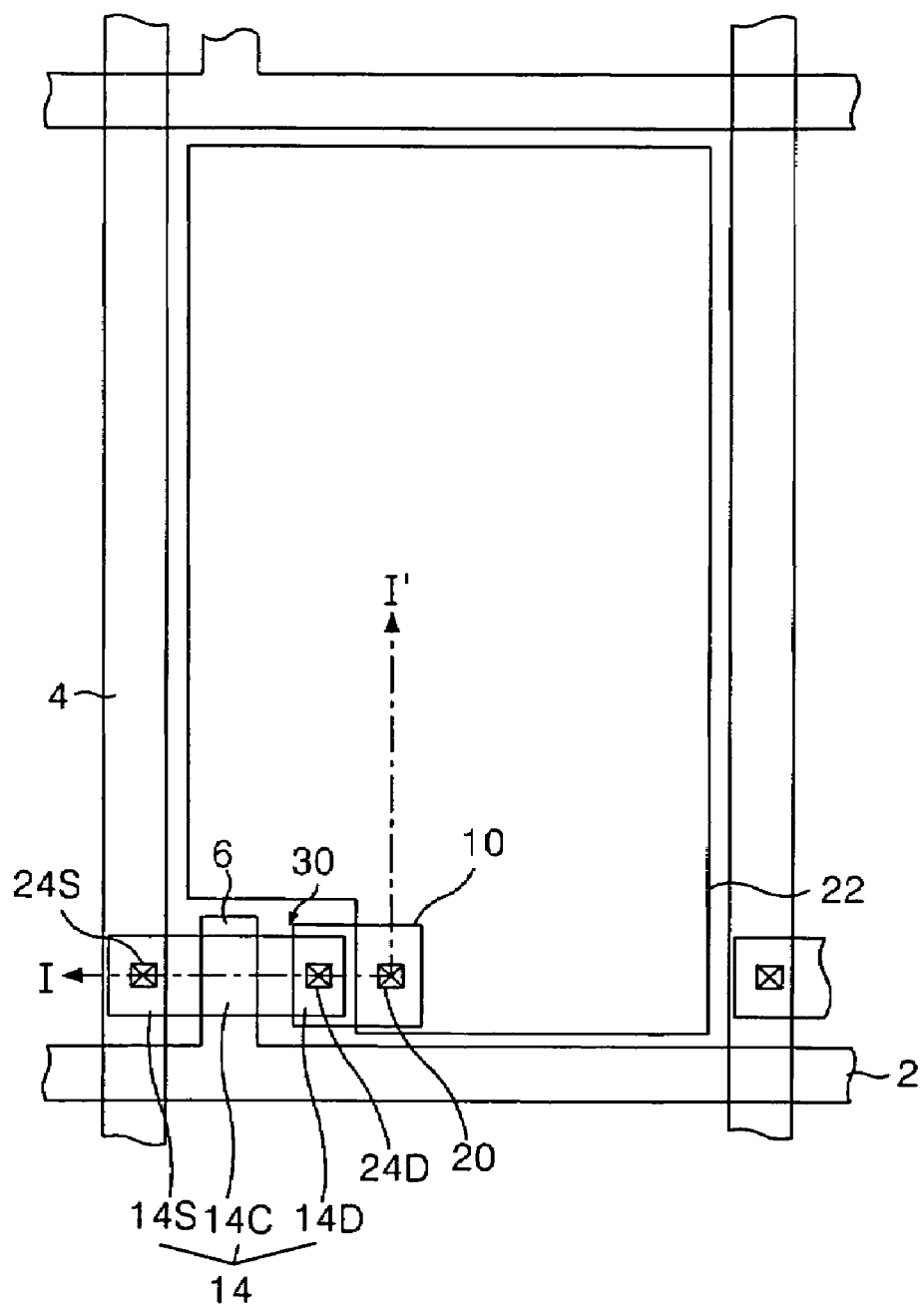
FIG. 1 a plan view illustrating part of a related art polysilicon thin film transistor substrate.

*Description of reference numerals for main parts in the drawings*

| | |
|---|---|
| 1,100: substrate | 2,102,202: gate line |
| 4,104: data: line | 6,106,206: gate electrode |
| 10,110: drain electrode | 12,112: buffer film |
| 14,114,150: active layer | 14S,114S: source area |
| 14D,114D: drain area | 14C,114C: channel area |
| 16,116: gate insulating film | 18: passivation film |
| 20: pixel contact hole | 22,122,222: pixel electrode |
| 24S,124S: source contact hole | 24D,124D: drain contact hole |
| 26,118: interlayer insulating film | 30,130: thin film transistor |
| 152: storage line | 160: storage capacitor |
| 101,201: transparent conductive layer | 103,203: metal layer |
| 120: transmission hole | 170,270: photo-resist pattern |

DETAILED DESCRIPTION OF THE INVENTION

Object of the Invention

Field of the Invention and Discussion of the Related Art

The present invention relates to a thin film transistor substrate of a liquid crystal display panel using polysilicon, and more particularly to a poly type thin film transistor substrate reduces the number of processing steps without any process defects, and a fabricating method thereof.

Generally, a liquid crystal display LCD device has liquid crystal cells that are arranged in a matrix in a liquid crystal display panel to control the light transmittance of the liquid crystal in accordance with a video signal to display a picture.

A thin film transistor (hereinafter, referred to as "TFT") is used as a switch device to independently supply a video signal to each of the liquid crystal cells. 20 Amorphous silicon or polysilicon is used as an active layer for the TFT. When using polysilicon, in which the charge mobility is approximately 100 times as fast as amorphous silicon, a drive circuit with a high response speed may be embedded in the liquid crystal display panel.

The poiy type liquid crystal display panel includes a TFT substrate, in which the drive circuit is fonned together with the TFT, and a color filter substrate, in which the color filter is formed, with liquid crystal therebetween.

Figure 2:
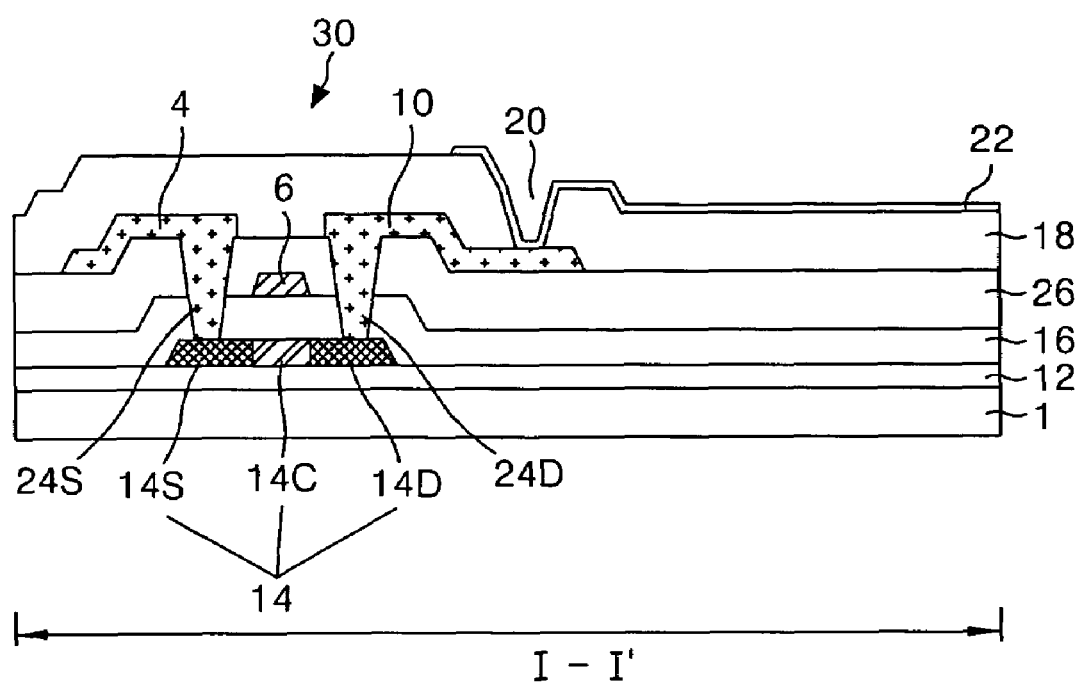
FIG. 2 is a sectional diagram illustrating the thin film transistor shown in FIG. 1, taken along the line I-I'.

FIG 1 is a plan view illustrating part of a poly type TFT substrate, and FIG. 2 is a sectional diagram illustrating the TFT substrate shown in FIG. 1, taken along the line I-I'.

The TFT substrate shown in FIGS. 1 and 2 includes a TFT 30 connected to a gate line 2 and a data line 4, and a pixel electrode 22 connected to the TFT 30. The TFT 30 is formed as an N-type or P-type, but the case of being formed as the N-type is only explained below.

The TFT 30 includes a gate electrode 6 connected to the gate line 2, a source electrode included as part of the data line 4, and a drain electrode 10 connected to the pixel electrode 22 through a pixel contact hole 20 penetrating a passivation film 18. The gate electrode 6 overlaps a channel area 14C of an active layer 14, which is formed 15 on a buffer film 12, with a gate insulating film 16 therebetween. The source electrode and the drain electrode 10 are formed with an interlayer insulating film 26 between the gate electrode 6 and the source and drain electrodes. And the source electrode and the drain electrode 10 are respectively connected to a source area 14S and a drain area 14D of the active layer 14, into which n+ impurities are injected, through a source contact hole 24S and a drain contact hole 24D which penetrate the interlayer insulating film 26 and the gate insulating film 16.

The poly type TFT substrate is formed using six mask processes, as in FIGS. 3A to 3F.

Figure 3A:
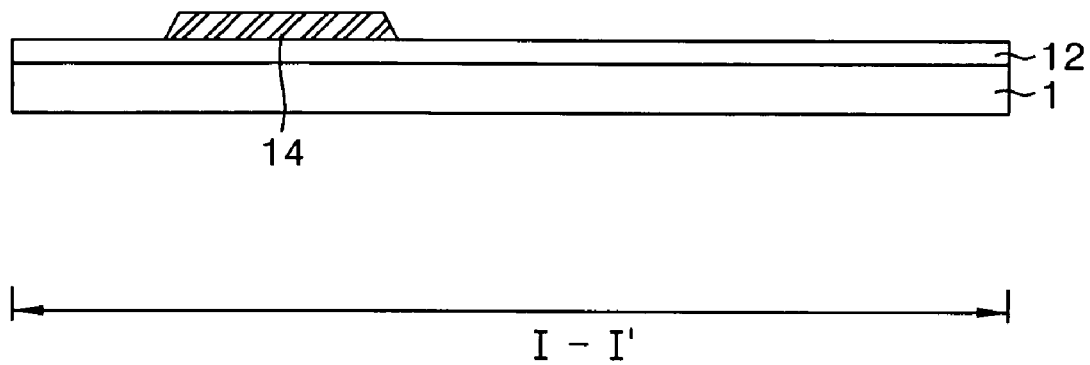
FIGS. 3A to 3F are sectional diagrams for explaining a fabricating method of the thin film transistor substrate shown in FIG. 2 step by step.

Referring to FIG. 3A, a buffer film 12 is formed on a lower substrate 1, and the active layer 14 is formed thereon by a first mask process.

An amorphous silicon is deposited on the buffer film 12 and crystallized by a laser to produce polysilicon, and then the polysilicon is patterned by a photolithography process and an etching process using a first mask, thereby forming the active layer 14.

Figure 3B:
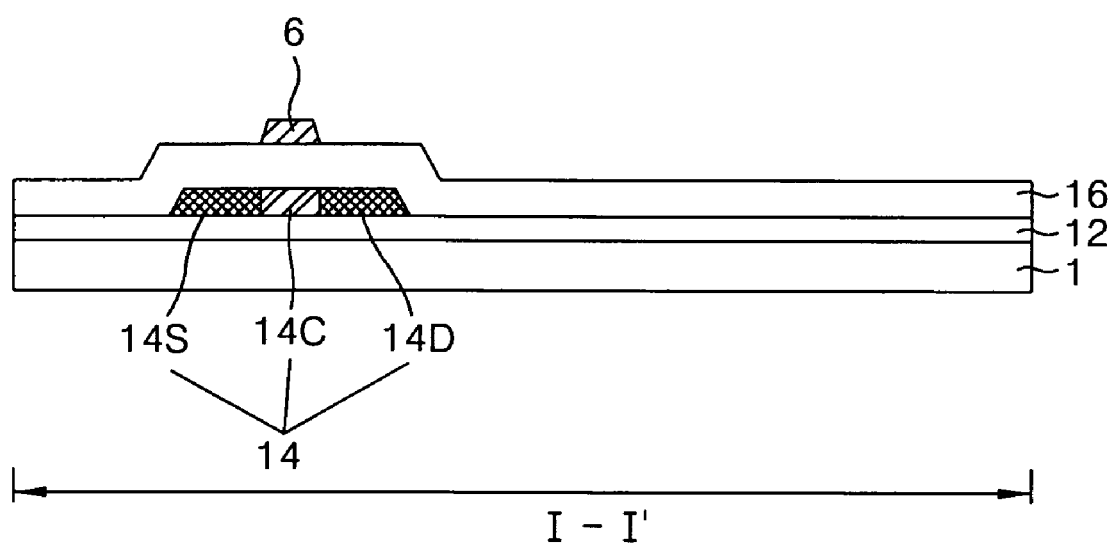

Referring to FIG 3B, the gate insulating film 16 is formed on the buffer film 12 where the active layer 14 is formed, and the gate line 2 and the gate electrode 6 are formed thereon by a second mask process.

Next, N+ impurities are injected into a non-overlapping area of the active layer 14 using the gate electrode 6 as a mask, thereby forming the source area 14S and the drain area 14D of the active layer 14.

Figure 3C:
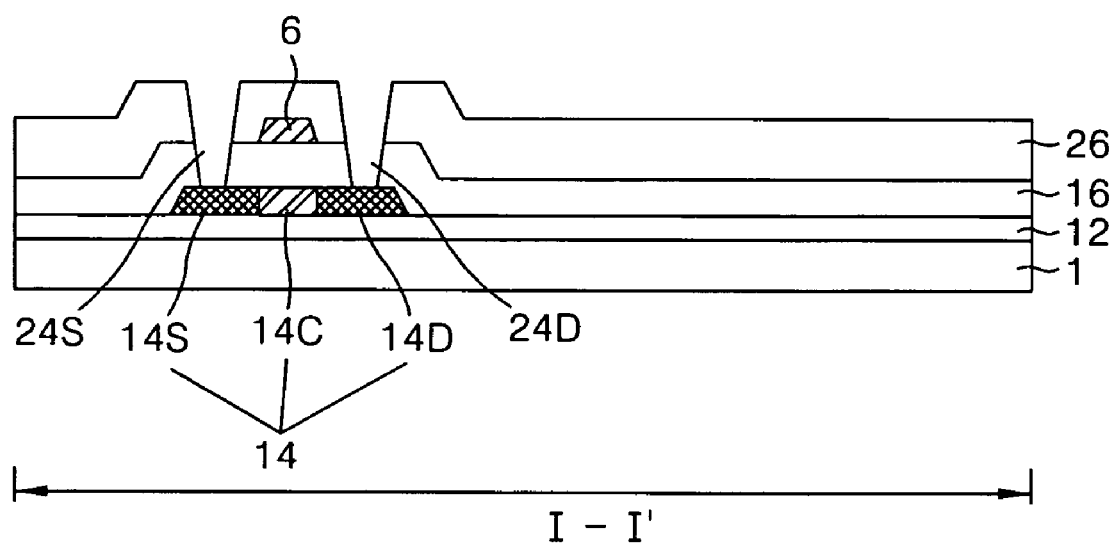

Referring to FIG. 3C, the interlayer insulating film 26 is formed on the gate insulating film 16 where the gate line 2 and the gate electrode 6 are formed, and the source and drain contact holes 24S, 24D penetrating the interlayer insulating film 26 and the gate insulating film 16 are formed by a third mask.

Figure 3D:
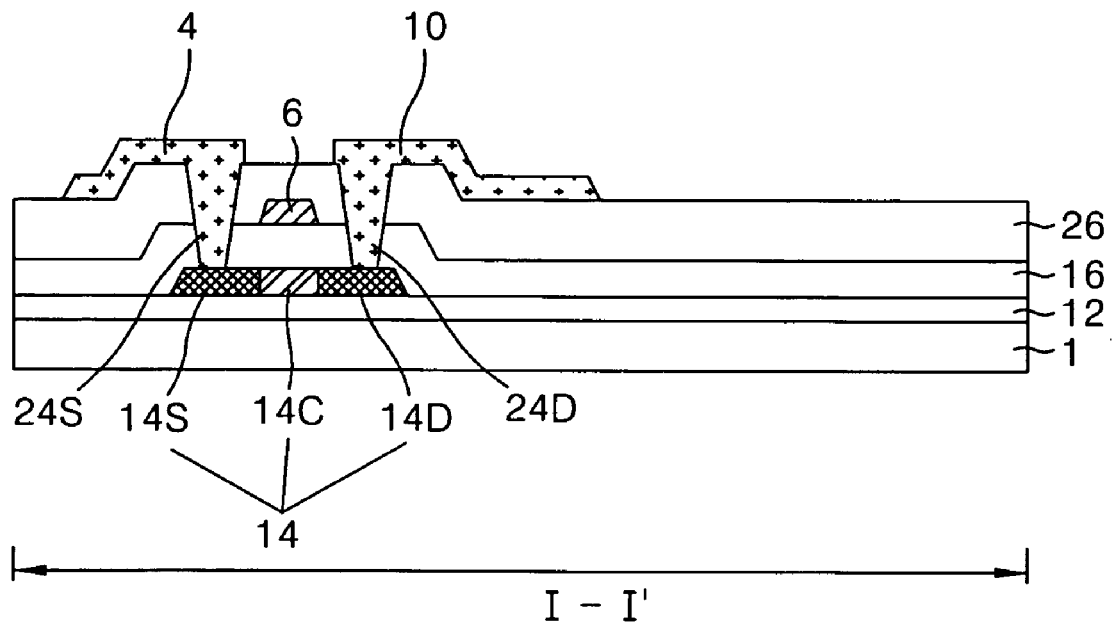

Referring to FIG. 3D, the data line 4 having the source electrode and the drain electrode 10 are formed on the interlayer insulating film 26 by a fourth mask process.

Figure 3E:
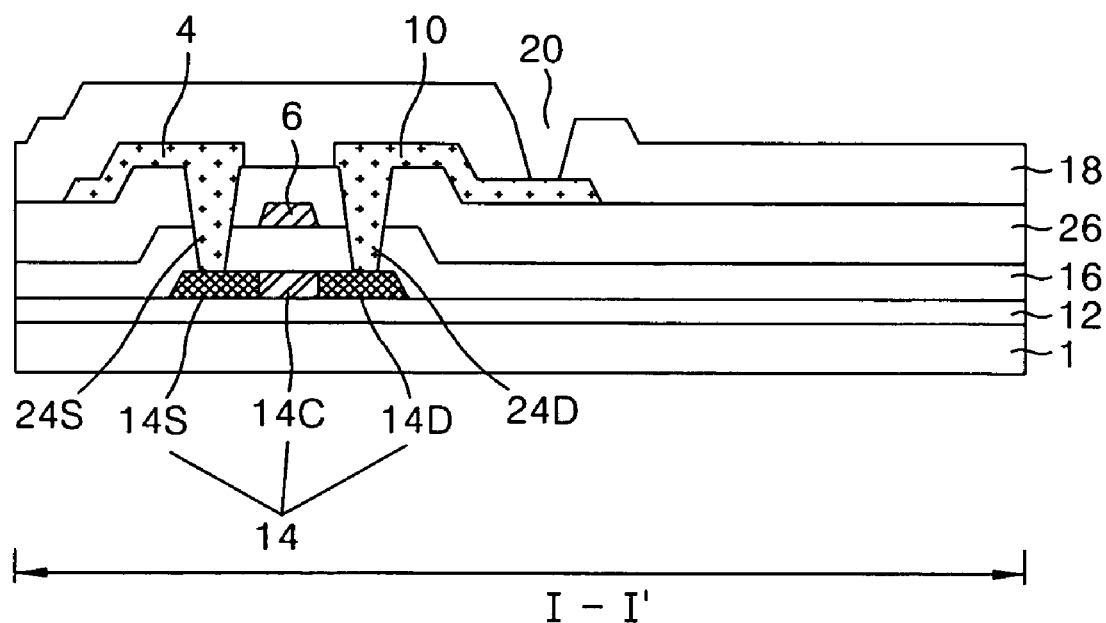

Referring to FIG. 3E, the passivation film 18 is formed on the interlayer insulating film 26 where the data line 4 and the drain electrode 10 are formed, and a pixel contact hole 20 penetrating the passivation film 18 to expose the drain electrode 10 is formed by a fifth mask process.

Figure 3F:
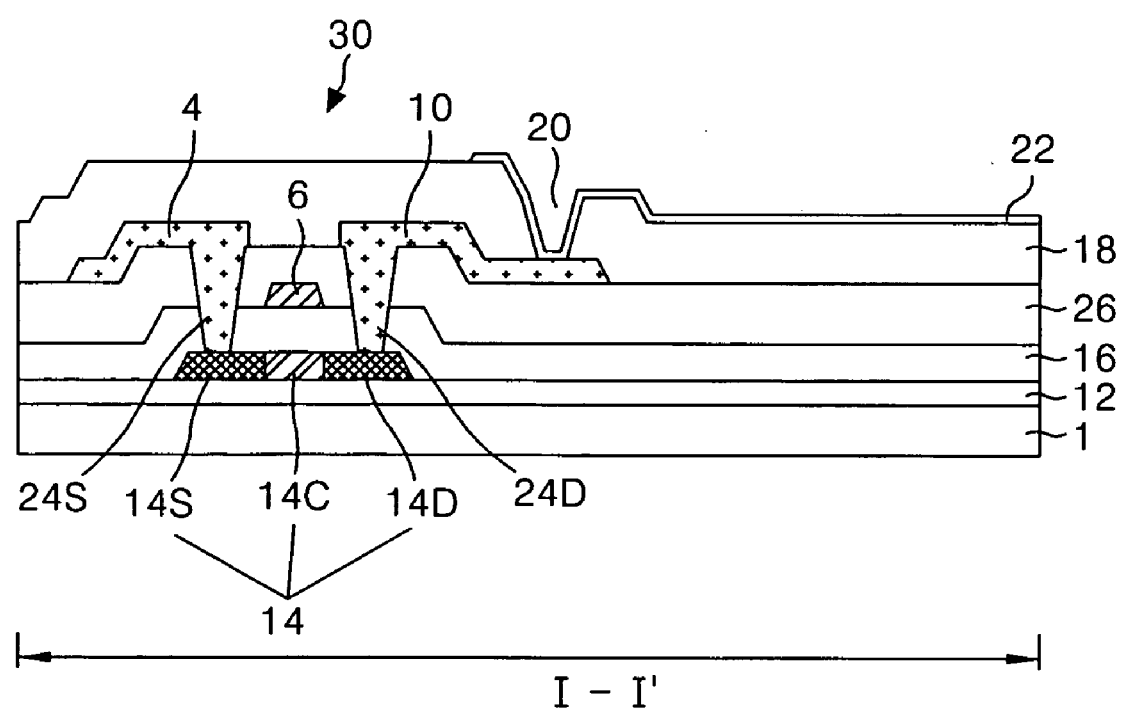

Referring to FIG. 3F, a transparent pixel electrode 22 is formed on the passivation film 18 by a sixth mask process.

In this way, the related art poiy type TFT substrate is formed by the six mask processes, thus its fabricating processes are complicated. This is because one mask process includes many processes like a thin film deposition process, a cleaning process, a photolithography process, an etching process, a photo-resist peeling process, an inspection process, and so on. Accordingly, in order to reduce cost, a method is required so that the number of mask processes of the poly type TFT substrate are reduced without defect.

TECHNICAL TASKS TO BE ACHIEVED BY THE INVENTION

Accordingly, it is an object of the present invention to provide a poly type thin film transistor substrate that is adaptive for reducing the number of processes without any process defect, and a fabricating method thereof.

PREFERRED EMBODIMENTS OF THE INVENTION

To achieve these objects and other advantages and in accordance with the purpose of the invention, as embodied and broadly described herein, a poly type thin film transistor substrate comprises a gate line with a double conductive layer structure; a data line crossing the gate line with an interlayer insulating film in between to define a pixel area; a pixel electrode formed of the double conductive layer structure in the pixel area and a lower conductive layer of the double conductive layer is exposed through a transmission hole; and a thin film transistor having a gate electrode with the double conductive layer structure connected to the gate line, a source electrode connected to the data line, a drain electrode connected to the pixel electrode, and a poly type active layer forming a channel between the source electrode and the drain electrode, wherein the double conductive layer is formed to have an edge of the lower conductive layer substantially aligned with an edge of an upper conductive layer or where the lower edge is located outside the upper edge.

The poiy type thin film transistor substrate further comprises a storage capacitor connected to the thin film transistor, wherein the storage capacitor includes a storage line with the double conductive layer structure, the storage line being substantially parallel to the gate line; and a second poly type active layer extending from the poly type active layer to overlap the storage line with a gate insulating film in between.

In another aspect of the present invention, a method of fabricating a poly type thin film transistor substrate comprises forming transparent lower conductive layer and upper conductive layers on a substrate; forming a photo-resist pattern on the upper conductive layer; patterning the upper conductive layer by using the photo-resist pattern as a mask; ashing the photo-resist pattern so as to remain on the upper conductive layer; patterning the lower conductive layer by a dry etching method using the patterned upper conductive layer as a mask; and removing the remaining photo-resist pattern.

In another aspect of the present invention, a method of fabricating a poly type thin film transistor substrate comprises forming a buffer film on a substrate; forming a poly type active layer on the buffer film using a first mask; forming a gate insulating film which covers the active layer; forming a double conductive layer on the gate insulating film; forming a gate line, a gate electrode, and a pixel electrode by patterning the double conductive layer using a second mask so that the line width of a lower conductive layer is equal to or wider than the line width of an upper conductive layer; forming an interlayer insulating film which covers the patterned double conductive layer; forming source and drain contact holes exposing source and drain areas of the active layer and a transmission hole exposing the pixel electrode using a third mask; and forming a data line crossing the gate line and source and drain electrodes connected to the source and drain areas of the active layer on the interlayer insulating film using a fourth mask.

Reference will now be made in detail to embodiments of the present invention, examples of which are illustrated in the accompanying drawings.

With reference to FIGS. 4 to 16, embodiments of the present invention will be explained as follows.

Figure 4:
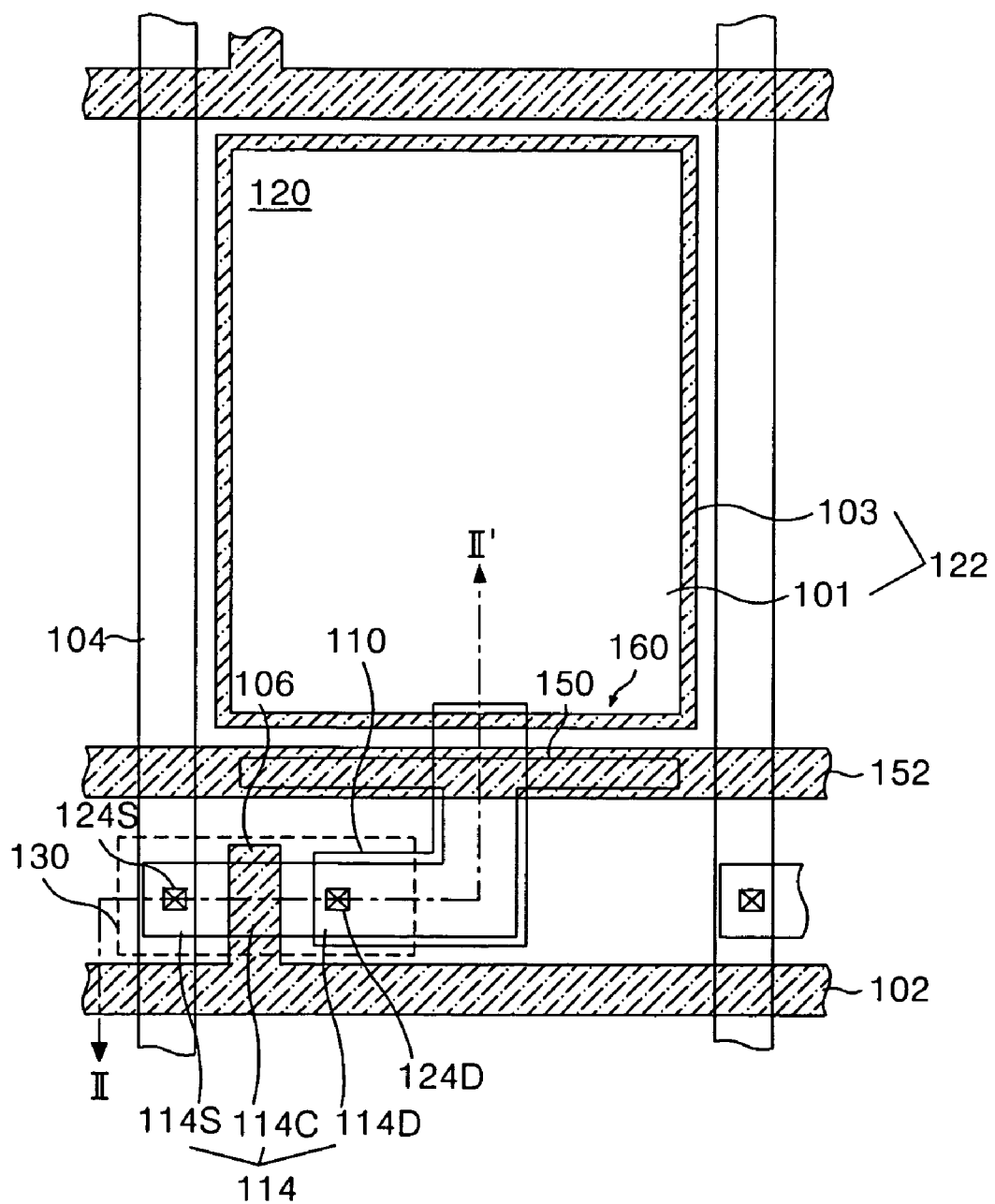
FIG. 4 is a plane view illustrating part of a polysilicon thin film transistor substrate according to a first embodiment of the present invention.
Figure 5:
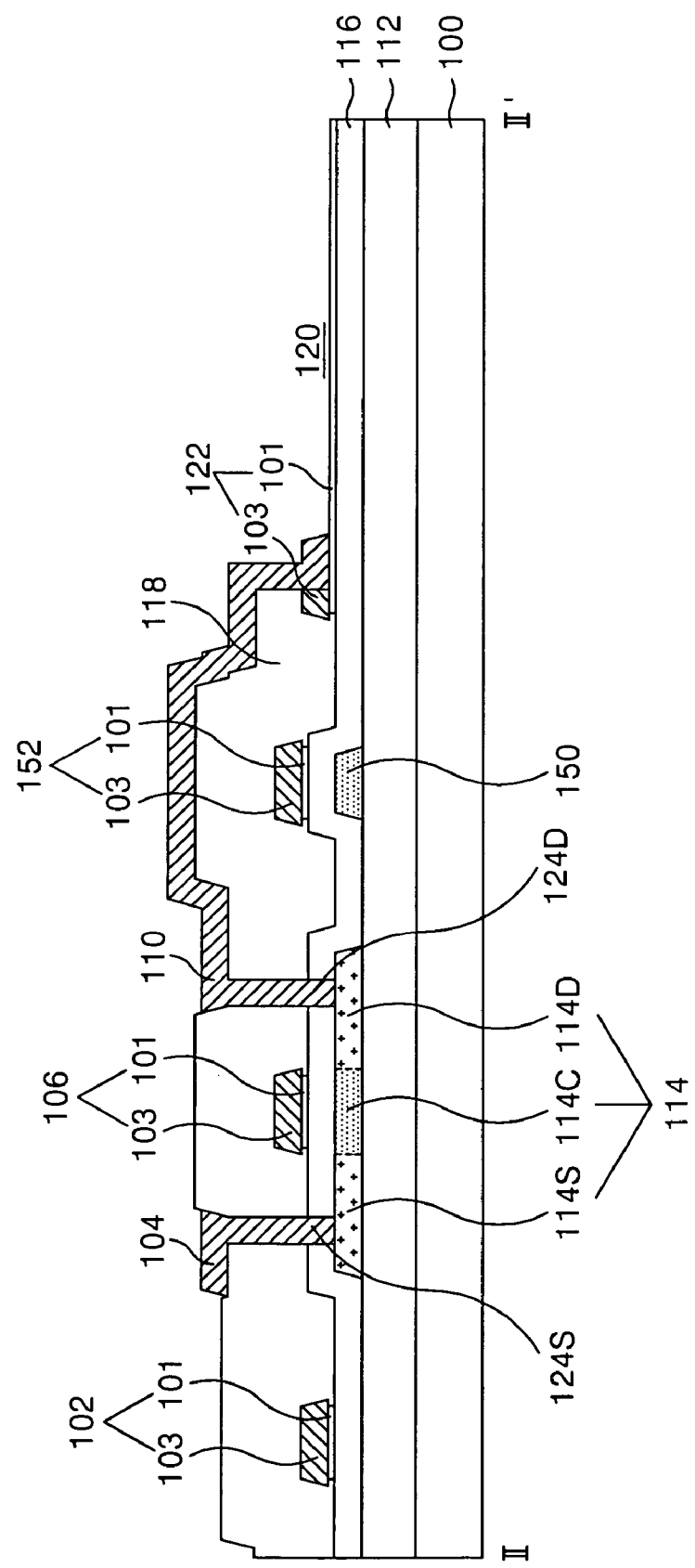
FIG. 5 is a sectional diagram illustrating the thin film transistor substrate shown in FIG. 4, taken along the line II-II'.

FIG. 4 is a plan view illustrating part of a poly type thin film transistor substrate according to a first embodiment of the present invention, and FIG. 5 is a sectional diagram illustrating the TFT substrate shown in FIG. 5, taken along the line II-II'.

The poly type TFT substrate shown in FIGS. 4 and 5 includes: a gate line 102 and a data line 104 that define a pixel area; a TFT 130 connected thereto; a pixel electrode 122 and a storage capacitor 160 connected to the TFT; and a storage line 152 connected to the storage capacitor 160. The TFT 130 is formed as an N-type or P-type, but the example of the N-type is only explained below.

The data line 104 crosses the gate line 102 and the storage line 152 with an interlayer insulating film 118 therebetween to define the pixel area where the pixel electrode 122 is formed.

The TFT 130 supplies a video signal on the data line 104 to the pixel electrode 120 in response to a gate signal on the gate line 102. The TFT 130 includes: a gate electrode 106 connected to the gate line 102; a source electrode included in the data line 104; a drain electrode 110 connected to the pixel electrode 122; and a first active layer 114 which forms a channel between the source electrode and the drain electrode 110.

The gate line 102 and the gate electrode 106 together with the storage line 152 have a double layer structure where a transparent conductive layer 101 is deposited and the metal layer 103 is deposited thereon.

The first active layer 114 is formed on a lower substrate with a buffer film 112 therebetween. The first active layer 114 includes a channel area 114C which overlaps with the gate electrode 106 with a gate insulating film 116 therebetween, and a source area 114S and a drain area 114D into which N impurities are implanted and that have the channel area 114C therebetween. The source area 114S and the drain area 114D of the first active layer 114 are respectively connected to the source electrode included in the data line 104 and the drain electrode 110 through a source contact hole 124S and a drain contact hole 124D that penetrate an interlayer insulating film 118 and a gate insulating film 116.

The pixel electrode 122 like the gate line 102, the gate electrode 106, and the storage line 152 have a double layer structure where the transparent conductive layer 101 and the metal layer 103 are deposited on the gate insulating film 116. Specifically, the transparent conductive layer 101 of the pixel electrode 122 is exposed through a transmission hole 120 penetrating the interlayer insulating film 118 and the metal layer 103 for transmitting light. The metal layer 103 of the pixel electrode 122 has a remaining overlapping part between the interlayer insulating film 118 and the transparent conductive layer 101 along the border of the transmission hole 120. And, the pixel electrode 122 is connected to the drain electrode 110 that crosses the storage line 152 from the TFT 130 and extends along the side surface of an aperture part 120. Specifically, the drain electrode 110 is connected to the metal layer 103 and transparent conductive layer 101 of the pixel electrode 122 that is exposed through the transmission hole 120. The pixel electrode 122 is charged with a video signal supplied from the thin film transistor 130 to generate a potential difference with a common electrode that is formed in a color filter substrate (not shown). The potential difference causes the liquid crystal located in the thin film transistor and the color filter substrate to rotate by dielectric anisotropy and to control the transmittance of light which is incident upon the pixel electrode 122 from a light source (not shown) so as to transmit the incident light toward the color filter substrate.

A storage capacitor 160 includes first and second storage capacitors connected in parallel between the TFT 130 and the storage line 152. The first storage capacitor is formed where the storage line 152 overlaps a second active layer 150 extending from the first active layer 114 with the gate insulating film 112 in between. The second storage capacitor is formed where the drain electrode 110 crosses the storage line 152 with the interlayer insulating film 118 in between. The storage capacitor 160 charges the video signal on the pixel electrode 120 to be stably stored.

The poly type TFT substrate of the present invention has the pixel electrode 122 formed together with the gate line 102, the gate electrode 106, and the storage line 152 that have a double layer structure. As a result, the TFT substrate may be formed by four mask processes as shown in FIGS. 6A to 6D.

Figure 6A:
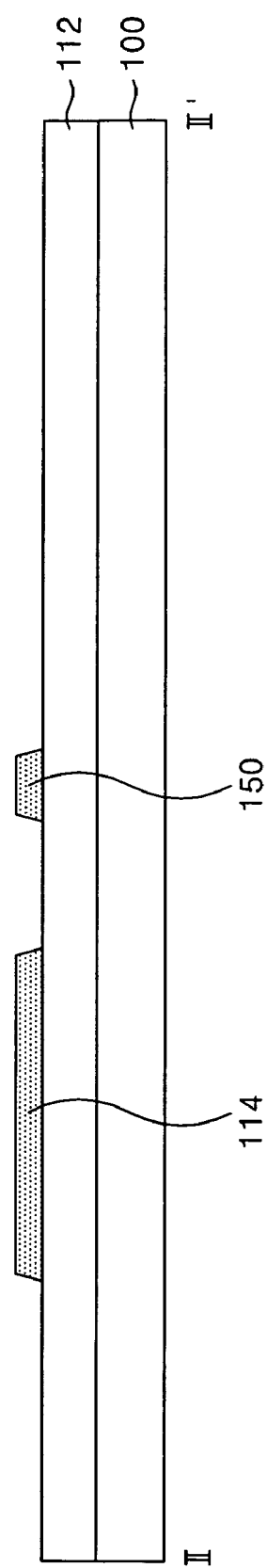

Referring to FIG. 6A, the buffer film 112 is formed on the lower substrate 100, and the integrated first and second active layers 114 and 150 are formed thereon by a first mask process.

The buffer film 112 is formed on the lower substrate 100. Then, an amorphous silicon thin film is formed on the buffer film 112 by a method such as LPCVD (low pressure chemical vapor deposition), PECVD (plasma enhanced chemical vapor deposition) and so on, and then it is crystallized to form a polysilicon thin film. Also, a de-hydrogenation process is performed to remove hydrogen atoms existing within the amorphous silicon thin film before crystallizing the amorphous silicon thin film.

Methods of crystallizing the amorphous silicon thin film include a SPC (solid phase crystallization) method where the amorphous silicon thin film is heat-treated in a high temperature furnace and an ELA (excimer laser annealing) method where a laser is used. The excimer laser annealing method is the most commonly used method. The excimer laser annealing method includes the most commonly used sequential lateral solidification (hereinafter, referred to as "SLS") method where a laser beam is scanned in a horizontal direction to make a grain grow in the horizontal direction, thereby improving its crystallization characteristic. The SLS method uses the principle that the grain grows in a horizontal direction from a border surface between liquid phase silicon and solid phase silicon. Accordingly, the SLS method has an advantage in that the irradiation range of the laser beam and the size of the laser energy may be controlled to make the grain grow to a designated length in the horizontal direction, thereby improving the size of the grain.

The polysilicon thin film is patterned by the photolithography process using the first mask and the etching process to form the integrated first and second active layers 114, 150.

Referring to FIG. 6B, the gate insulating film 116 is formed, and the pixel electrode 122 is formed thereon together with the gate line 102, the gate electrode 106, and the storage line 152 that all have a double structure by a second mask process.

The gate insulating film 116, the transparent conductive layer 101 and the metal layer 103 are deposited on the buffer film 112 where the first and second active layers 114, 150 are formed. The transparent conductive layer 101 and the metal layer 103 are patterned by the photolithography process using the second mask and the etching process, thereby forming the gate line 102, the gate electrode 106, the storage line 152, and the pixel electrode 122 having the double layer structure.

N+ impurities are then injected into the first active layer 114 using the gate electrode 106 as a mask to form the source area 114S and drain area 114D of the first active layer 114.

Figure 6C:
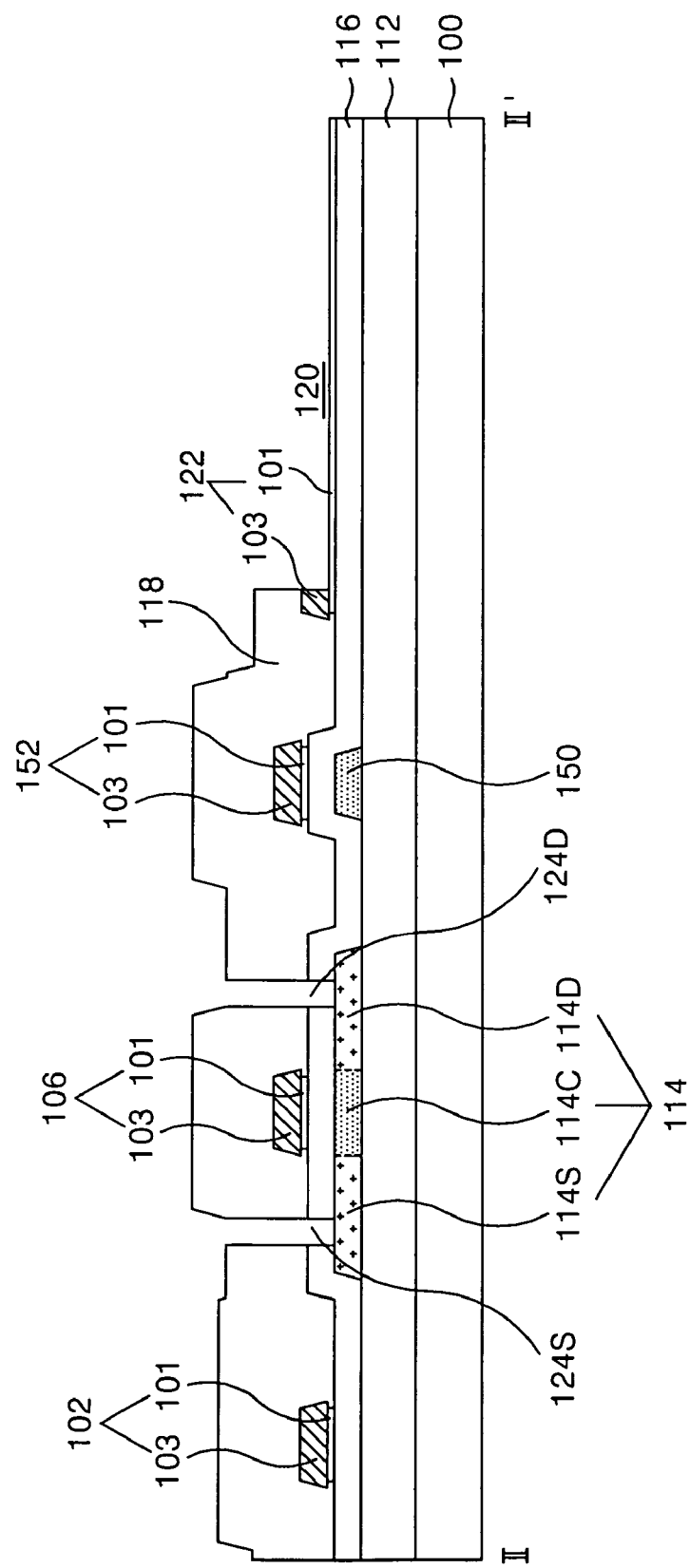

Referring to FIG. 6C, the interlayer insulating film 118 is formed having source and drain contact holes 124S, 124D and the transmission hole 120 by a third mask process.

The interlayer insulating film 118 is formed on the gate insulating film 116 over the gate line 102, the gate electrode 106, the storage line 152, and the pixel electrode 122. Then, the transmission hole 120 is formed by the photolithography process using the third mask and the etching process that exposes the pixel electrode 122 and the source and drain contact holes 124S, 124D that exposes the source area 114S and drain area 114D of the first active layer 114 by penetrating the interlayer insulating film 118 and the gate insulating film 116.

Figure 6D:
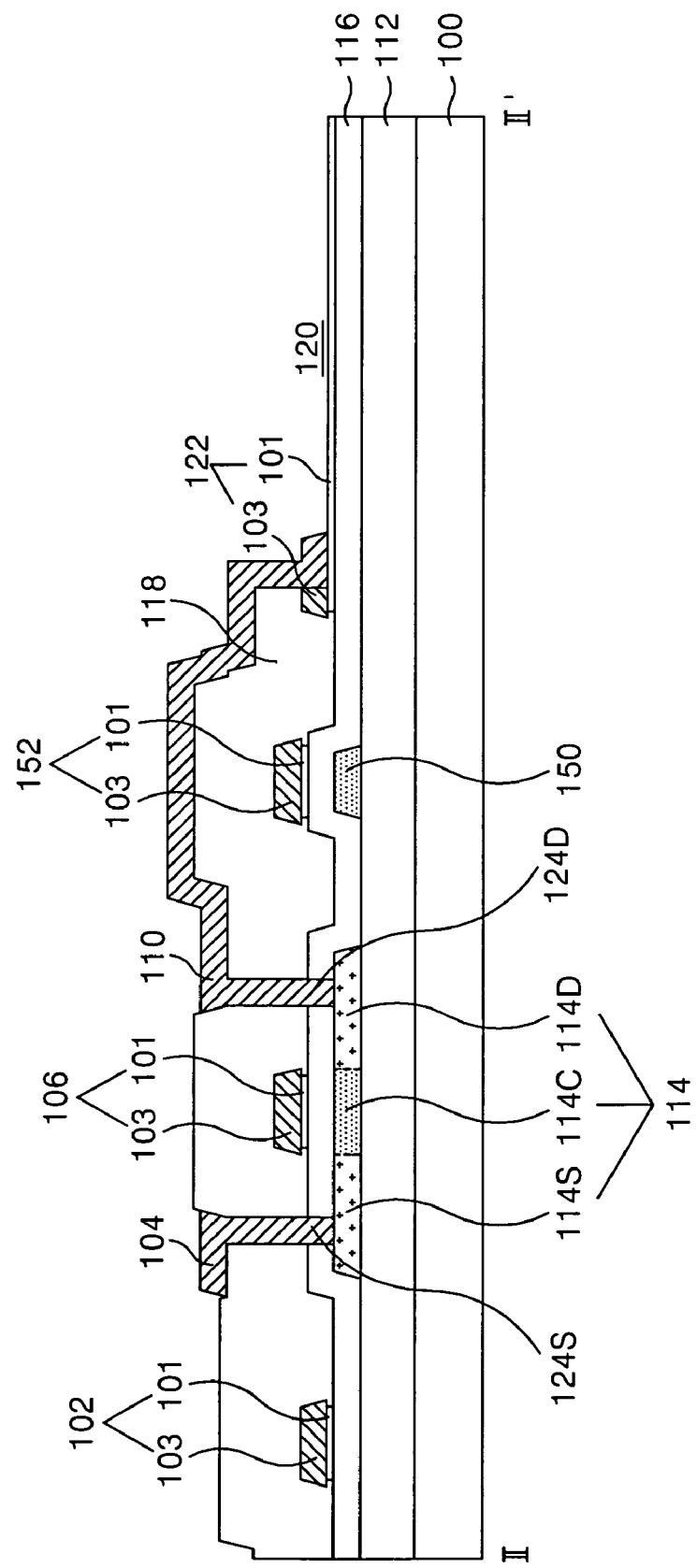
Figure 7:
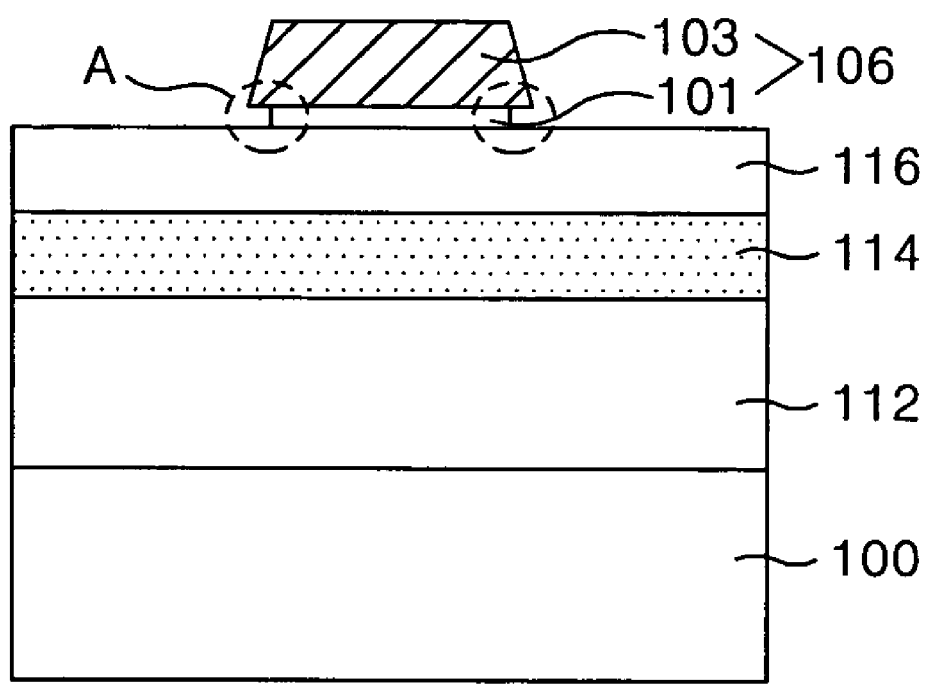
FIG. 7 is a sectional diagram illustrating an enlarged gate electrode part shown in FIG. 6B.

Referring to FIG 6D, the drain electrode 110 and the data line 104 having the source electrode are formed on the interlayer insulating film 118 by a fourth mask process.

The drain electrode 110 and the data line having the source electrode are formed by patterning a source/drain metal layer by the photolithography process using the fourth mask and an etching process after forming the source/drain metal layer on the interlayer insulating film 118. The data line 104 and the drain electrode 110 are respectively connected to the source area 114S and drain area 114D of the first active layer 114 through the source and drain contact holes 124S, 124D. The drain electrode 110 is extended to cross the storage line 152 to connect to the metal layer 103 and transparent conductive layer 101 of the pixel electrode 122 that is exposed through the transmission hole 120.

In this way, the poly type TFT substrate of the present invention has the pixel electrode 122 formed together with the gate line 102, the gate electrode 106, and the storage line 152 that have the double structure, thus the process may be simplified to four mask processes. As a result, the data line 104 and the drain electrode 110 has a exposed structure, but this may be formed to be sufficiently protected by an alignment film of an organic insulating material that is formed to be the uppermost layer of the TFT substrate for the liquid crystal alignment of the following process.

Then, in the second mask process of the present invention, where the transparent conductive layer 101 and the metal layer 103 that have the double layer structure are patterned, the upper metal layer 103 is etched, and then the lower transparent conductive layer 103 is etched. This is because there is no etchant for simultaneously etching the transparent conductive layer 101 and the metal layer 103. Like the gate electrode 106 shown in FIG. 7, there is a disadvantage in that the transparent conductive layer 101 of the lower part is overetched versus the metal layer 101 of the upper part to generate an under-cut area (A). In reference to FIG. 8A to 8D, the cause of the under-cut area (A) of the transparent conductive layer 101 is as shown.

Figure 8A:
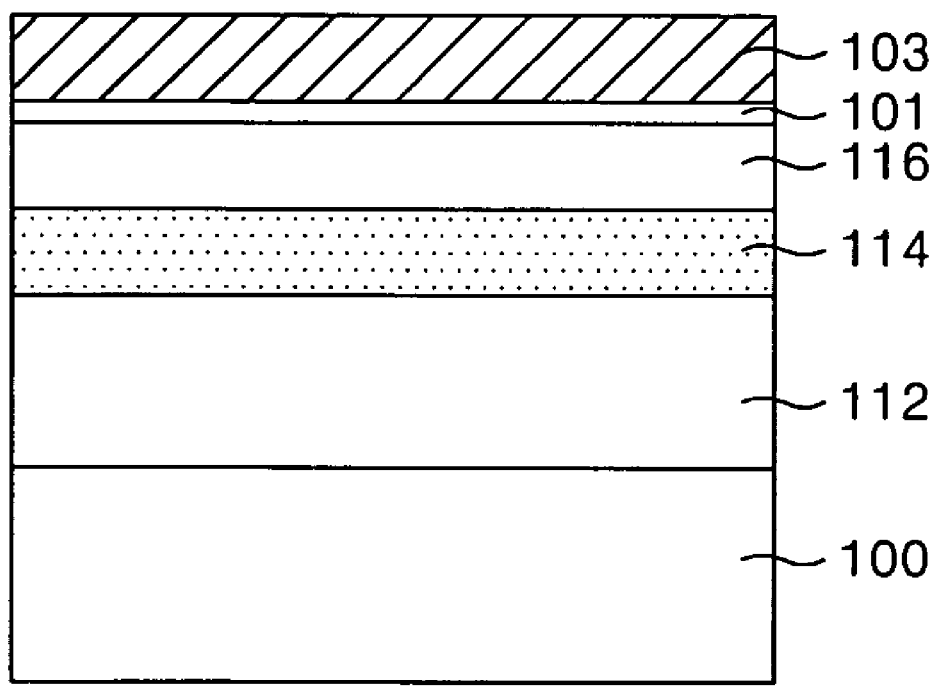
FIGS. 8A to 8D are sectional diagrams for explaining a method of forming the gate electrode shown in FIG. 7.

Referring to FIG 8A, the transparent conductive layer 101 and the metal layer 103 are sequentially formed by a deposition method such as sputtering on the substrate 100 where the buffer film 112, the first active layer 114, and the gate insulating film 116 are deposited.

Figure 8B:
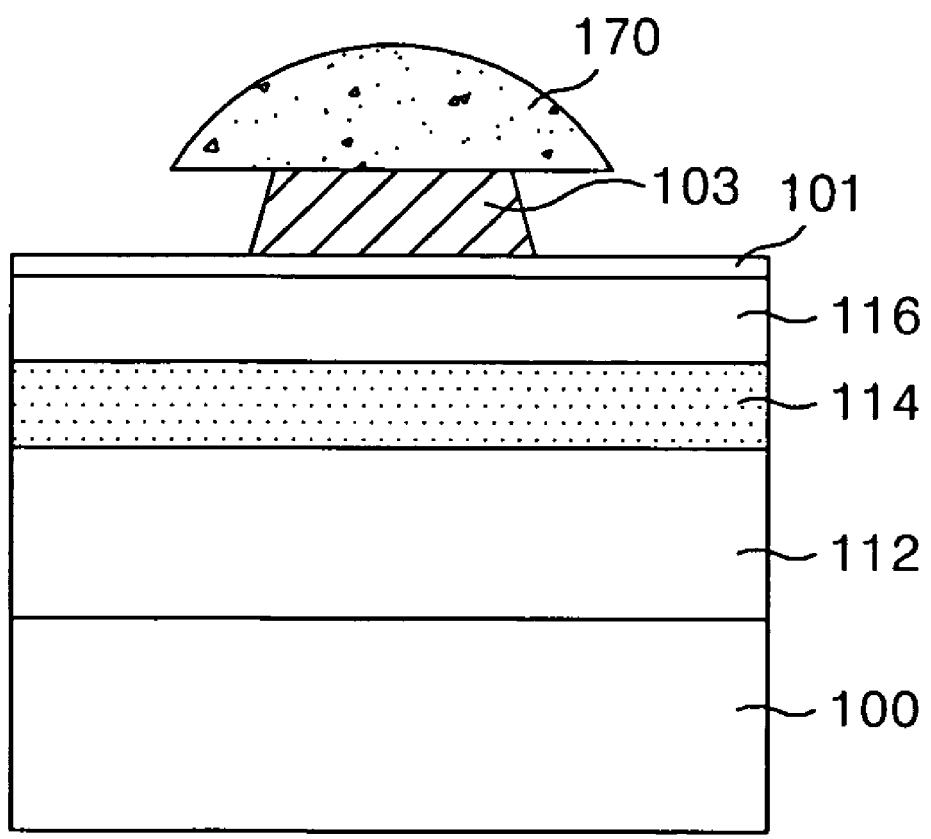

Then, as shown in FIG. 8B, a photo-resist pattern 170 is formed on the metal layer 103 by the photolithography process using a second mask, and part of the metal layer 103 that is exposed through the photo-resist pattern 170 is etched by a wet etching method.

Figure 8C:
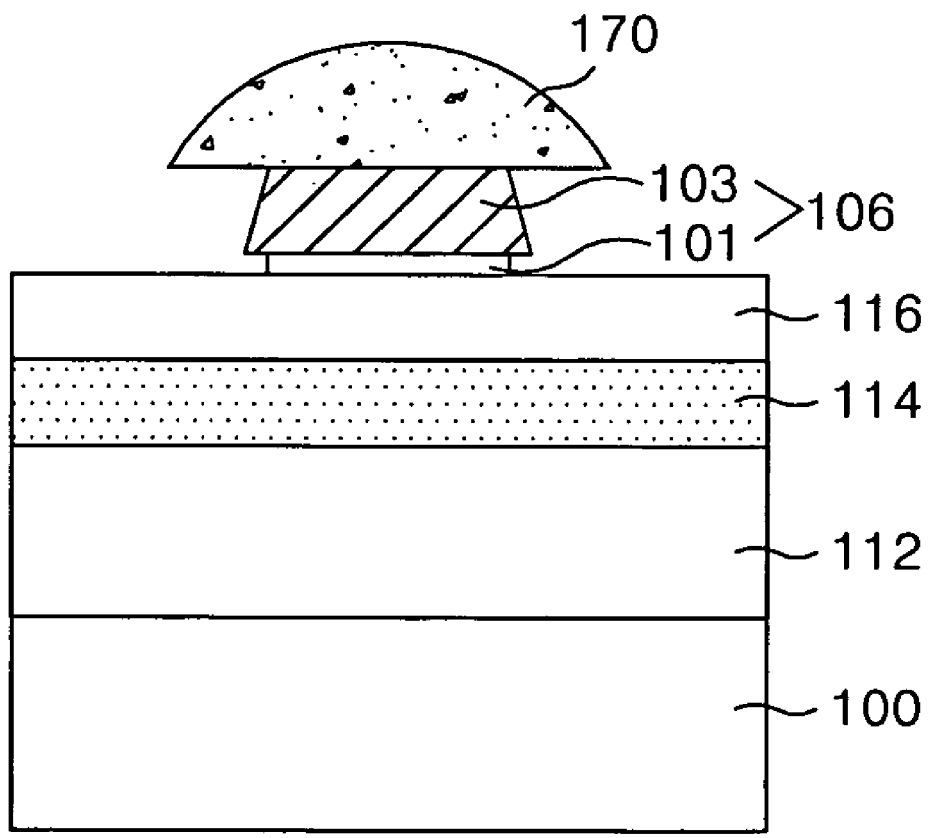
Figure 8D:
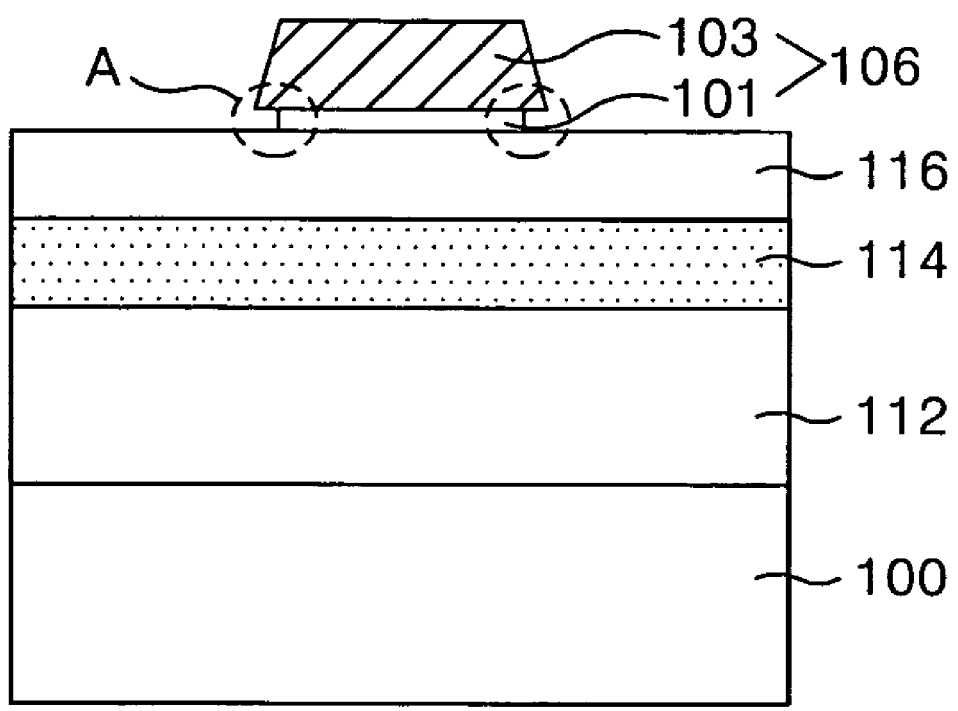

Subsequently, as shown in FIG. 8C, the transparent conductive layer 101 is patterned by the wet etching method using the photo-resist pattern 170 and the patterned metal layer 103 as a mask. In this case, the transparent conductive layer 101 is over-etched by the etchant that penetrates under the edge part of the patterned metal layer 103. As a result, an under-cut area (A) is generated where the edge of the patterned transparent conductive layer 101 is located inside the edge of the patterned metal layer 103.

In the gate electrode 106, the under-cut area (A) of the transparent conductive layer 101 increases the resistance of the first active layer 114 that overlaps with the gate electrode. As a result, due to the characteristic deterioration of the TFT 130, a problem occurs where the voltage of the video signal supplied from the TFT 130 to the pixel electrode 122 drops. Further, due to the under-cut area (A) of the transparent conductive layer 101 being the lower part of the gate electrode 106, a step coverage defect may occur when the interlayer insulating film 118 formed in the next process is opened.

In order to solve this problem, the second mask process of the poiy type TFT substrate according to the second embodiment of the present invention, as shown in FIGS. 9A to 9D, prevents over-etching a lower transparent conductive layer 206 versus an upper metal layer 203.

Figure 9A:
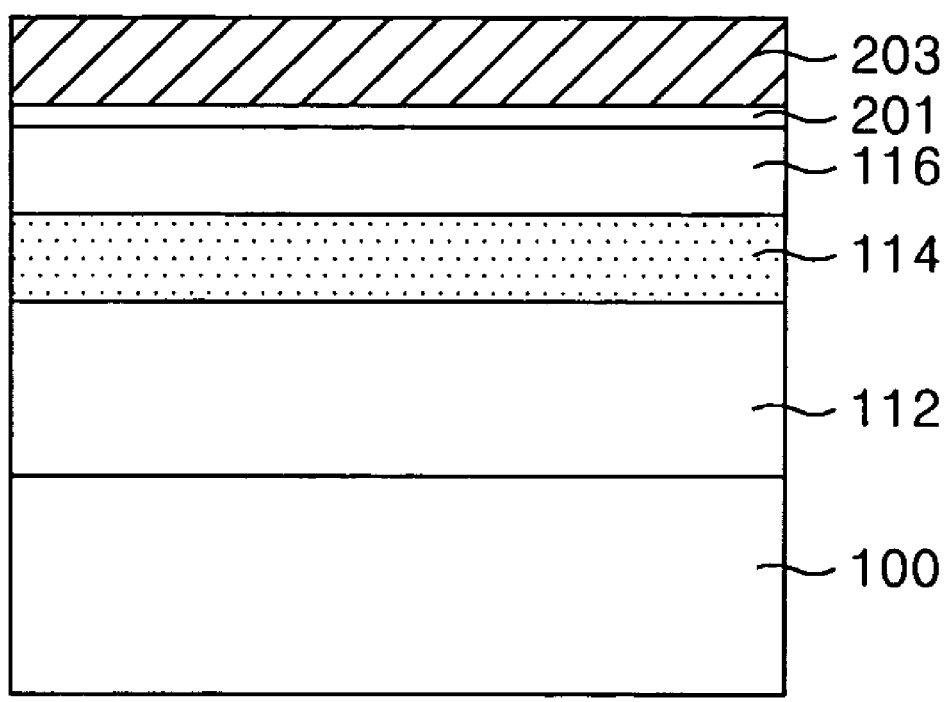
FIGS. 9A to 9D are sectional diagrams for explaining a method of forming a gate electrode in a polysilicon thin film transistor substrate according to a second embodiment of the present invention.

Referring to FIG. 9A, the transparent conductive layer 201 and the metal layer 203 are sequentially formed by a deposition method such as sputtering on the substrate 100 where the buffer film 112, the first active layer 114, and the gate insulating film 116 are deposited.

Figure 9B:
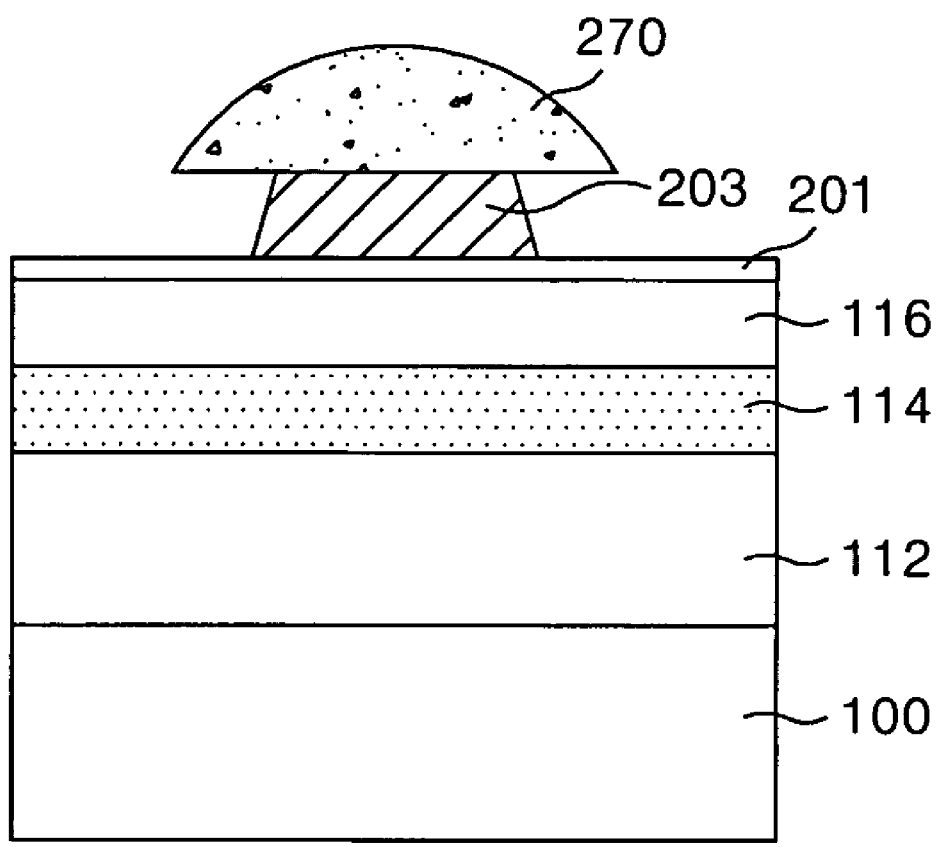

Then, as shown in FIG. 9B, the photo-resist pattern 270 is formed on the metal layer 203 by the photolithography process using a second mask, and part of the metal layer 203 that is exposed through the photo-resist pattern 270 is etched by the wet etching method.

Figure 9C:
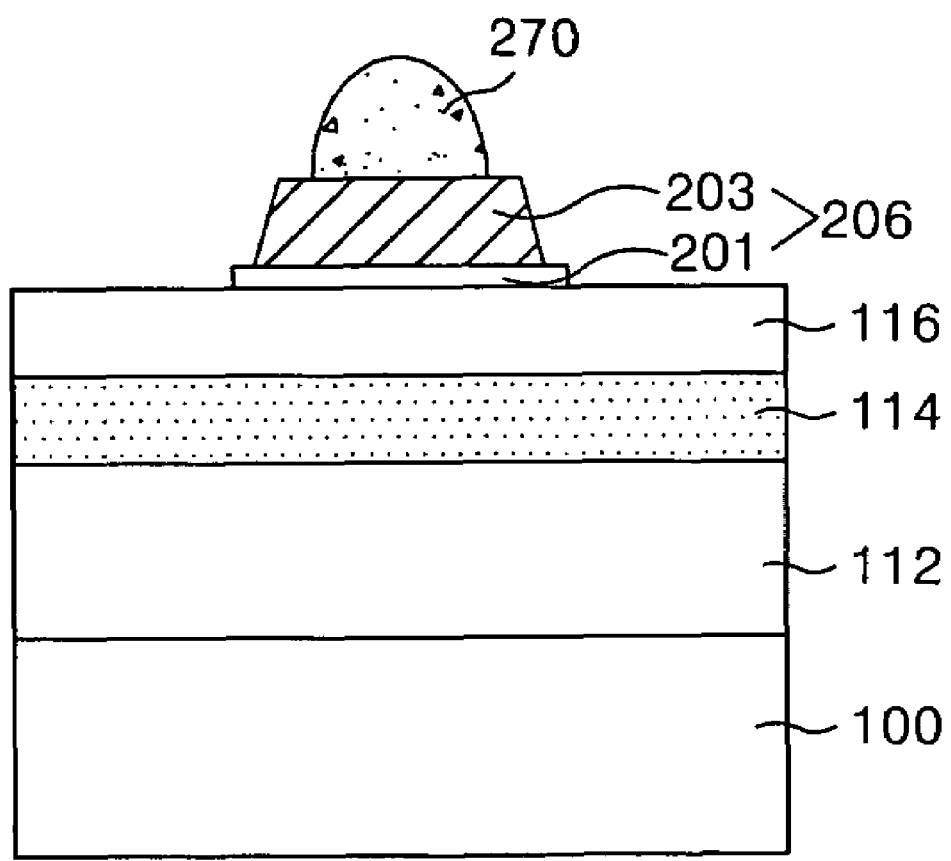

Subsequently, as shown in FIG 9C, part of the photo-resist pattern 270 is ashed so that the edge of the photo-resist pattern 270 is located inside the edge part of the patterned metal layer 203. Part of the transparent conductive layer 201 that is exposed through the patterned metal layer 203 is etched by a dry etching method. At this moment, the transparent conductive layer 201 is dry-etched by use of a gas etchant like HCl, HBr, HI, thereby perpendicularly etching the exposed part of the transparent conductive layer 201. Accordingly, the transparent conductive layer 201 can be prevented from being over-etched versus the metal layer 203. Specifically, the edge of the lower transparent conductive layer 201 is aligned with the edge of the upper metal layer 203, or extends slightly outward therefrom. Accordingly, the under-cut area of the transparent conductive layer 201 is not generated, thus it is possible to prevent the TFT characteristic deterioration and the process defect caused thereby.

Figure 9D:
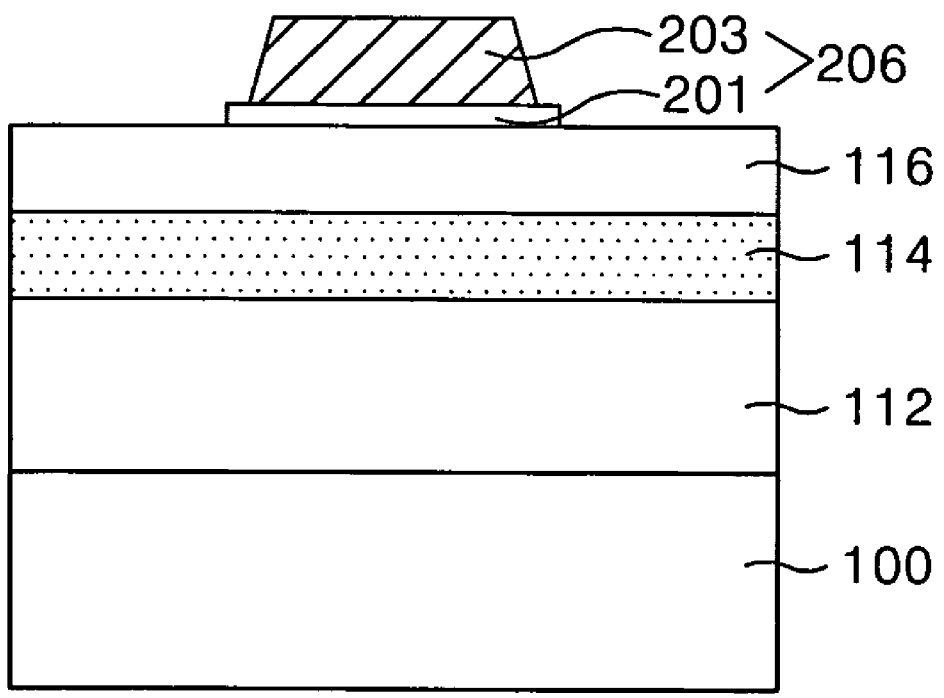

Next, the photo-resist pattern 270 shown in FIG. 9C is removed by a stripping process to complete the gate electrode 206 of the double layer structure, as shown in FIG. 9D.

Figure 10:
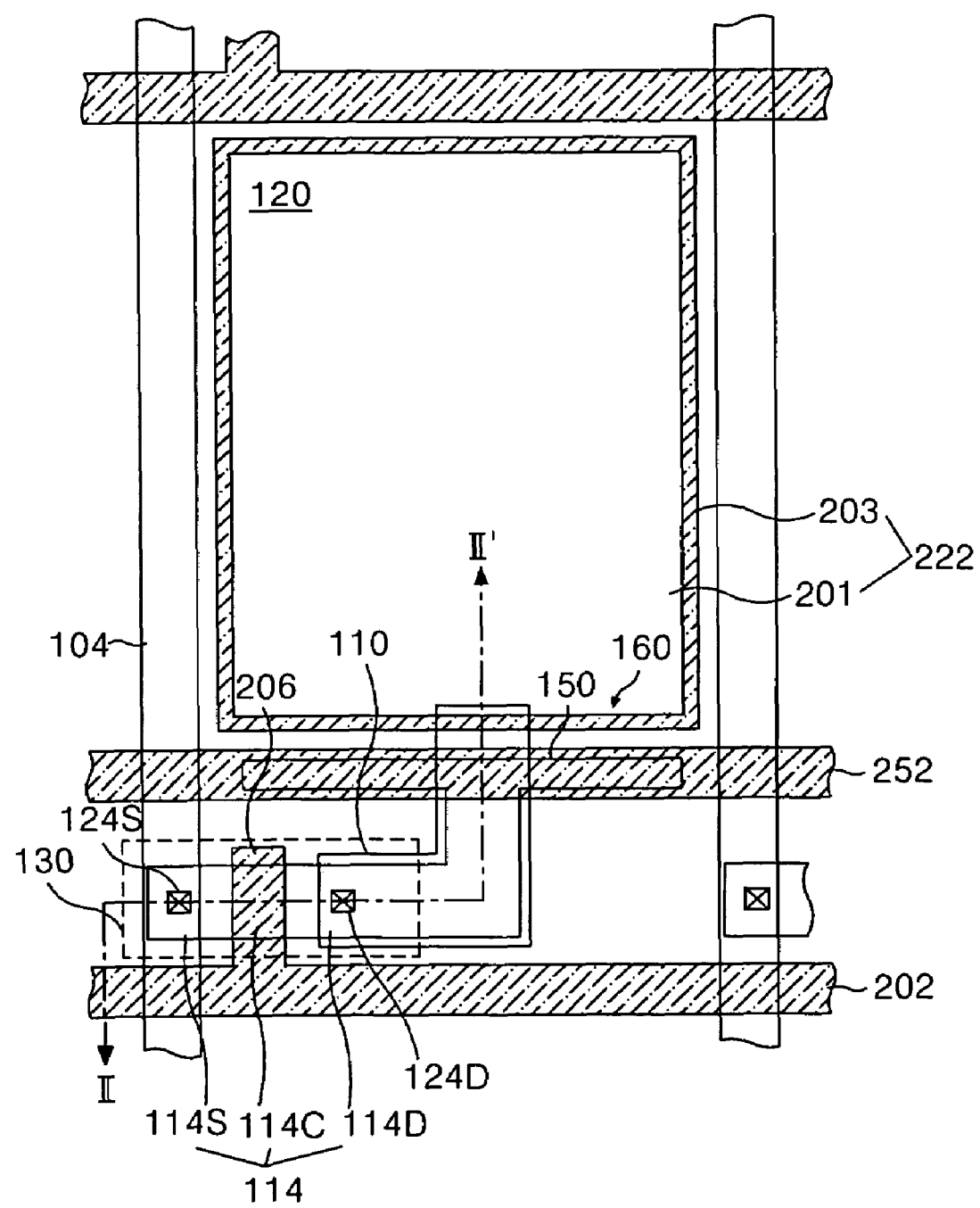
FIG. 10 is a plan view illustrating part of the polysilicon thin film transistor according to the second embodiment of the present invention.
Figure 11:
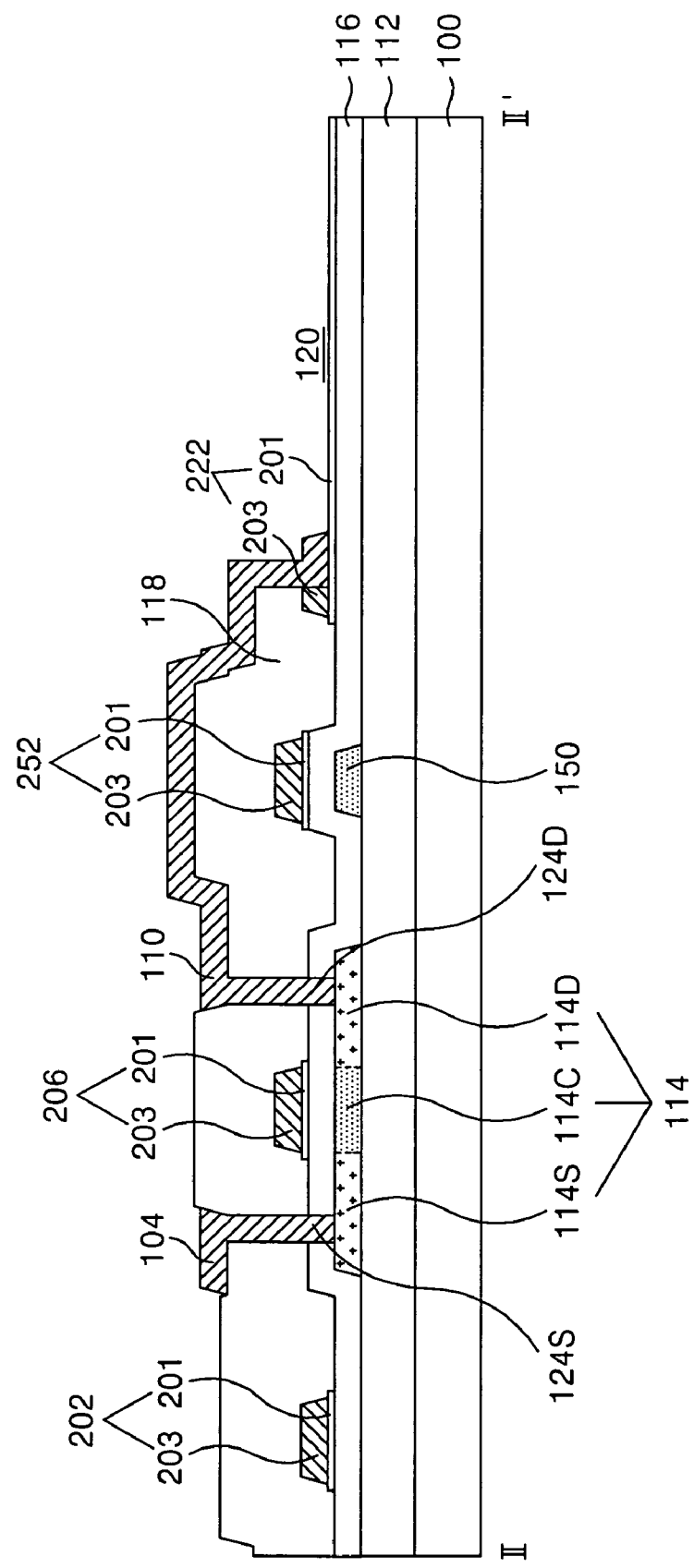
FIG. 11 is a sectional diagram illustrating the thin film transistor substrate shown in FIG. 10, taken along the line II-II'.

FIGS. 10 and 11 are a plan view and a sectional diagram illustrating the poly type TFT substrate according to the second embodiment of the present invention using the foregoing second mask process.

The poly type TFT substrate shown in FIGS. 10 and 11 includes the same components as the TFT substrate shown in FIGS. 4 and 5 except that a gate line 202, a gate electrode 206, a storage line 252, and a pixel electrode 222 have a different double layer structure therefrom, thus the description for the repeated components will be omitted.

In the poly type TFT substrate shown in FIGs. 10 and 11, the gate line 202, the gate electrode 206, the storage line 252, and the pixel electrode 222 have the double layer structure where the transparent conductive layer 201 and the metal layer 203 are deposited on the gate insulating film 116. The transparent conductive layer 201 of the pixel electrode 222 is exposed through the contact hole 120 that penetrates the interlayer insulating film 118 and the metal layer 203. In such a double layer structure, the edge part of the lower transparent conductive layer 201 is substantially aligned to the edge of the upper metal layer 203, or is formed to extend beyond. Accordingly, the under-cut area of the transparent conductive layer 201 is not generated, thus the characteristic deterioration of the TFT 130 caused thereby can be prevented, and it is possible to prevent a step coverage defect of the interlayer insulating film 118 where the interlayer insulating film is open at the edge of the transparent conductive layer 201.

Hereinafter, in reference to FIGS. 12A to 15B, a fabricating method of the poly type TFT substrate according to a second embodiment of the present invention shown in FIGS. 10 and 11 will be described in detail.

Figure 12A:
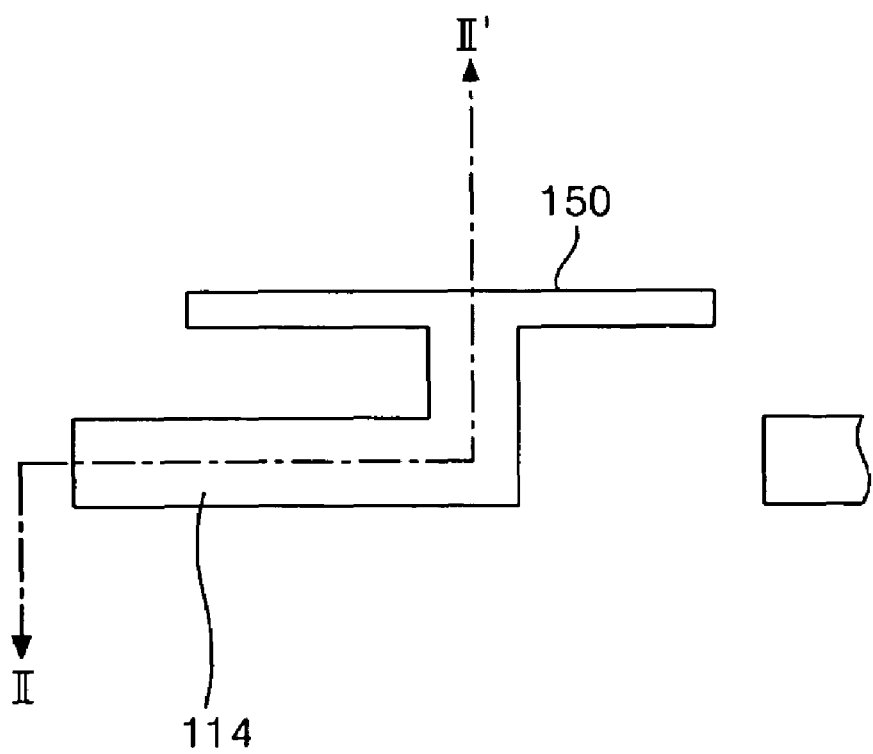
FIGS. 12A and 12B are a plan view and a sectional diagram for explaining a first mask process in a fabricating method of the thin film transistor substrate according to the second embodiment of the present invention.
Figure 12B:
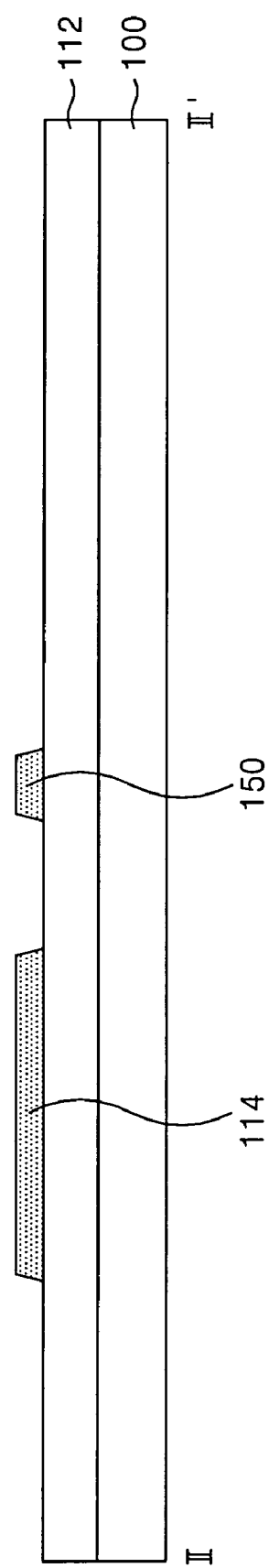

FIGS. 12A and 12B are a plan view and a sectional diagram for explaining a first mask process in the fabricating method of the poly type TFT substrate according to the second embodiment of the present invention.

Referring to FIGS. 12A and 12B, the buffer film 112 is formed on the lower substrate 100, and the first and second active layers 114, 150 integrated is formed thereon by a first mask process.

The buffer film 112 is formed by having the inorganic insulating material such as $SiO_2$ deposited on the entire surface of the lower substrate 100.

And then, the amorphous silicon thin film is formed on the buffer film 112 by the method such as LPCVD or PECVD is then crystallized to be a polysilicon thin film. At this time, a de-hydrogenation process is often performed to remove hydrogen atoms which exist within the amorphous silicon thin film before crystallizing the amorphous silicon thin film. As a method of crystallizing the amorphous silicon thin film, a SLS method is one of the excimer laser annealing methods that is typically used. In the SLS method, a laser beam is scanned in a horizontal direction to make a grain grow in the horizontal direction, thereby improving the size of the grain.

And, the polysilicon thin film is patterned by the photolithography process using the first mask and the etching process, thereby forming the integrated first and second active layers.

Figure 13A:
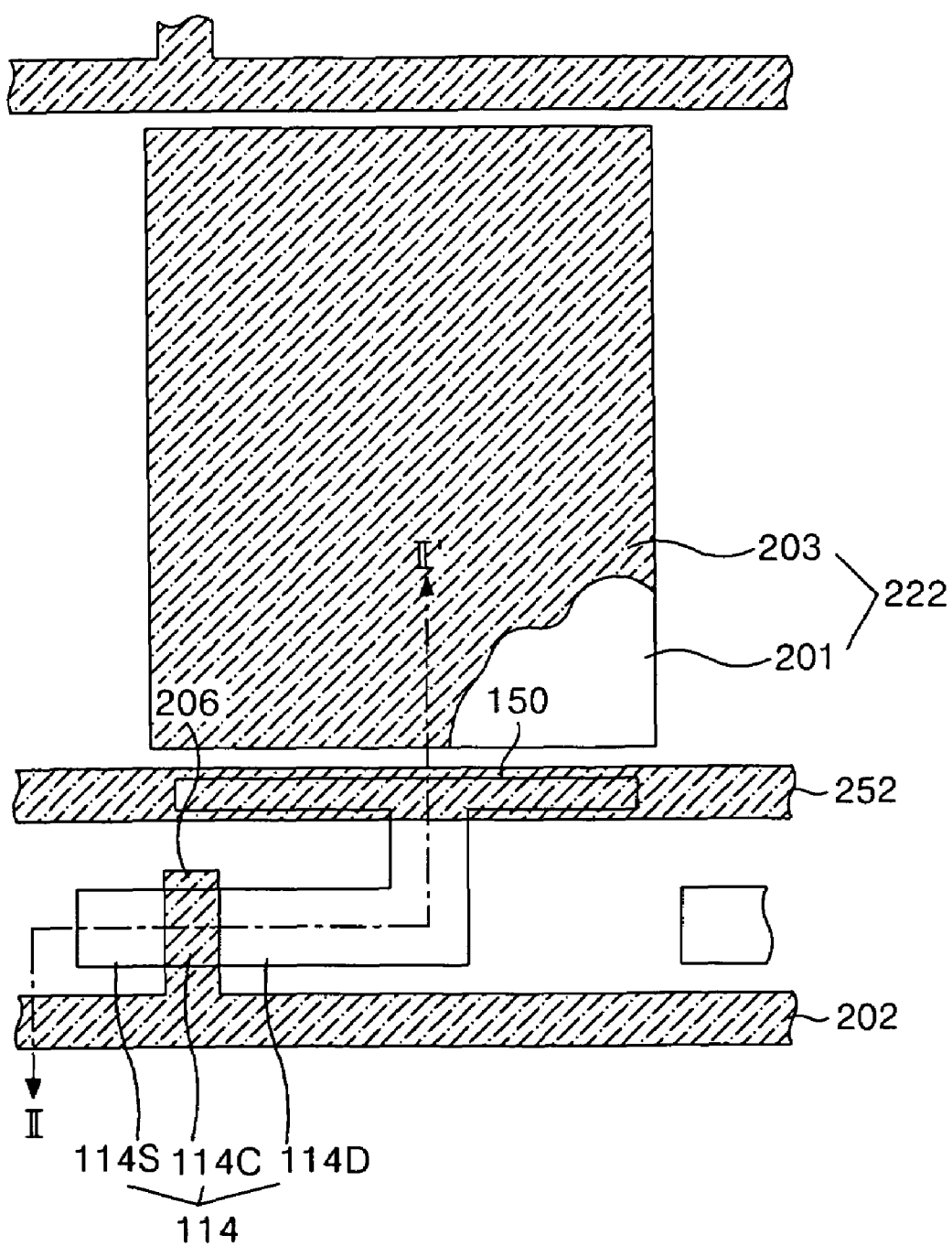
FIGS. 13A and 13B are a plan view and a sectional diagram for explaining a second mask process in a fabricating method of the thin film transistor substrate according to the second embodiment of the present invention.
Figure 13B:
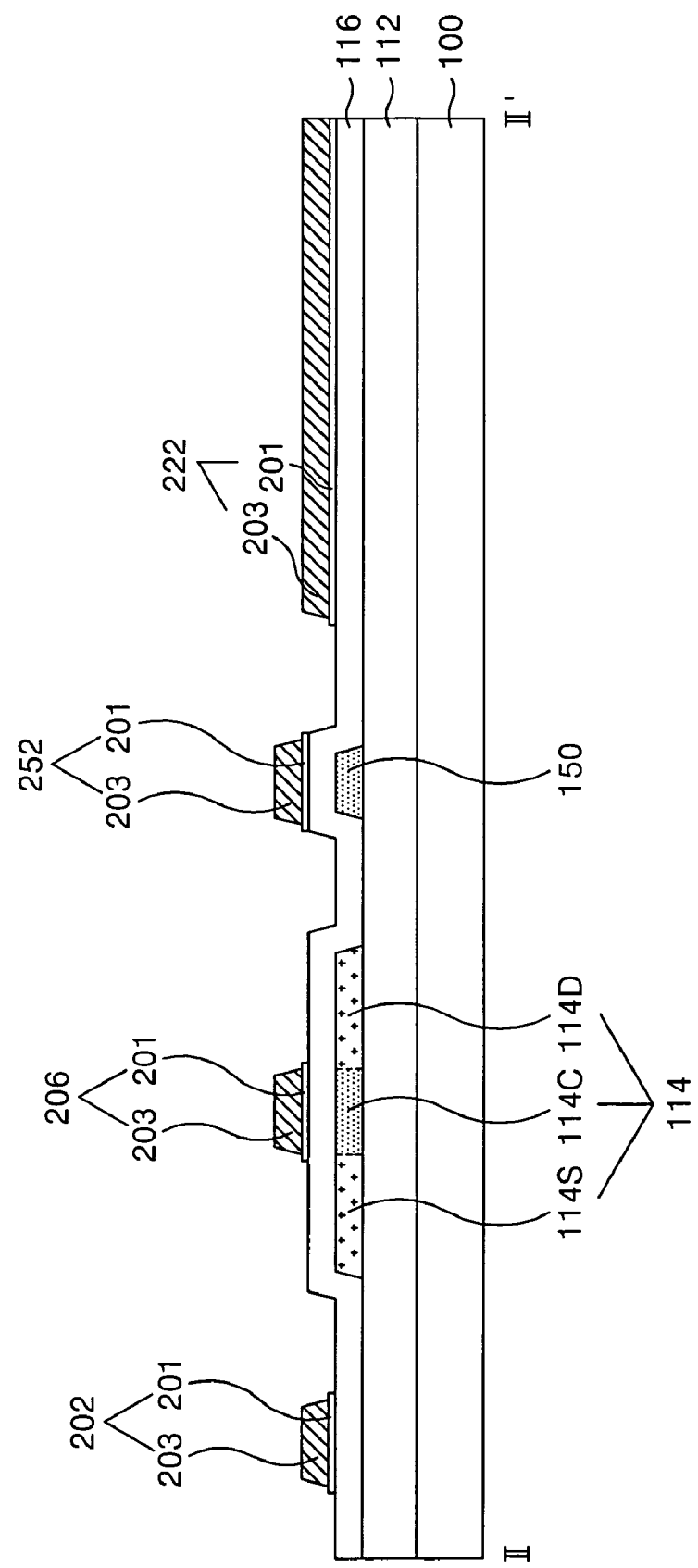

FIGS. 13A and 13B are a plain view and a sectional diagram for explaining a second mask process in the fabricating method of the poly type TFT substrate according to the second embodiment of the present invention.

Referring to FIGS. 13A and 13B, the gate insulating film 116 is formed on the buffer film 112 where the first and second active layers 114, 150 are formed, and a pixel electrode 222 together with the gate line 202, the gate electrode 206, and the storage line 252 are formed thereon to have the double layer structure by a second mask process.

The gate insulating film 116 is formed by having the inorganic insulating material such as $SiO_2$ deposited on the entire surface of the buffer film 112 where the first and second active layers 114, 150 are formed.

Subsequently, the transparent conductive layer 201 and the metal layer 203 are deposited on the gate insulating film 116 by the sputtering method. The transparent conductive layer 201 is formed of ITO (indium tin oxide), TO(tin oxide) or IZO (indium zinc oxide). The metal layer 203 is formed of Mo, Cu, Al, Ti, Cr, MoW or AlNd. Then, the photo-resist pattern is formed on the metal layer 203 by the photolithography process using the second mask, and the metal layer 203 exposed through the photo-resist pattern is etched by the wet etching method, thereby patterning the metal layer. And, part of the photo-resist pattern is ashed so that the edge of the photo-resist pattern is inside the edge of the patterned metal layer 203. Subsequently, the transparent conductive layer 201 exposed through the patterned metal layer is etched by the dry etching method, thereby patterning the transparent conductive layer 201. The transparent conductive layer 201 is etched in a vertical direction by a linear gas etchant, i.e., HCl, HBr, HI, thereby preventing the over-etching of the transparent conductive layer 201. The photo-resist pattern on the metal layer 203 is removed by the stripping process.

Further, N+ impurities are injected into the first active layer 114 using the gate electrode as a mask to form the source area 114S and the drain area 114D of the first active layer 114. The source area 114S and the drain area 114D of the first active layer 114 are opposite to each other with the channel area 114C therebetween, wherein the channel area 114C overlaps the gate electrode 106.

Figure 14A:
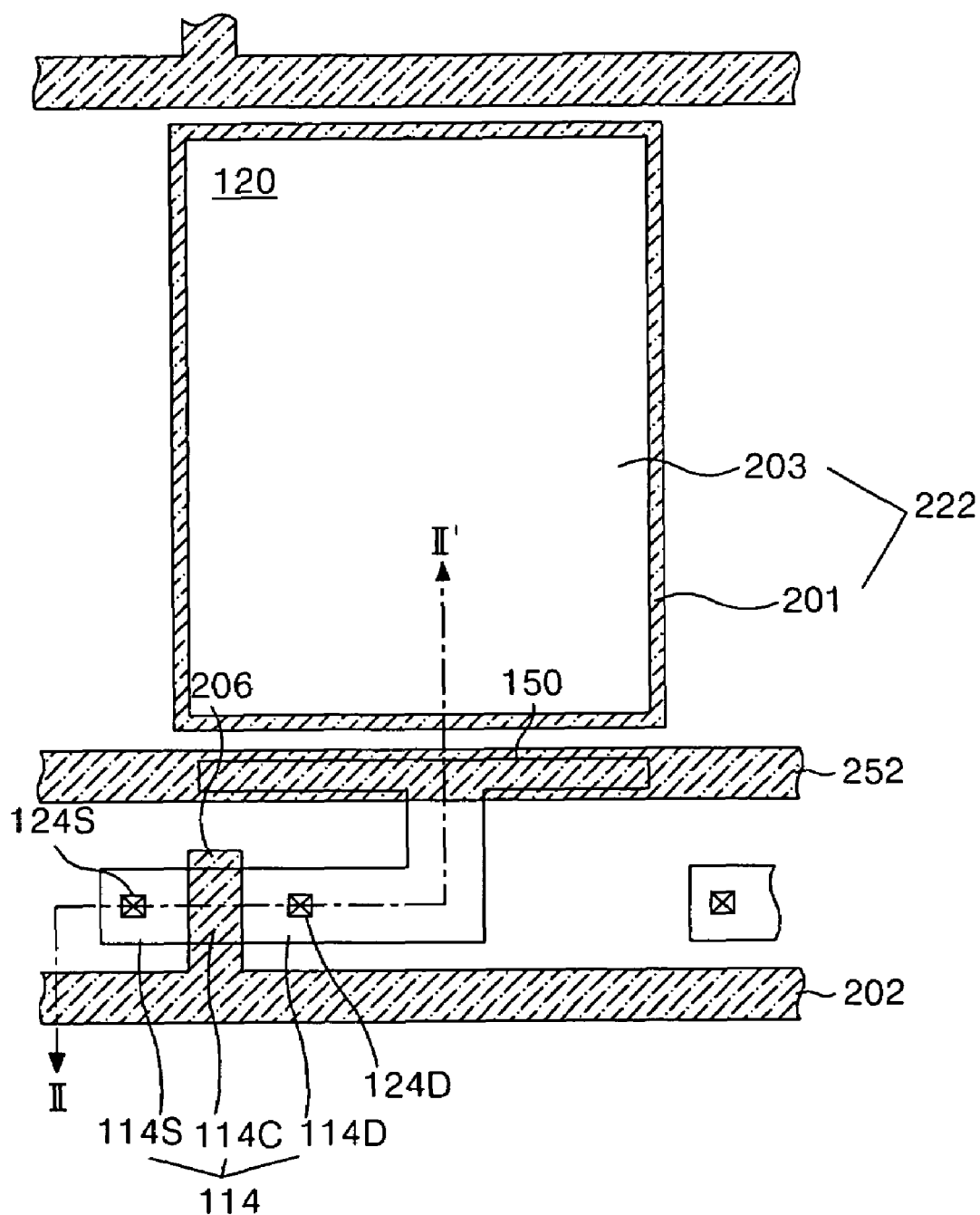
FIGS. 14A and 14B are a plan view and a sectional diagram for explaining a third mask process in a fabricating method of the thin film transistor substrate according to the second embodiment of the present invention.
Figure 14B:
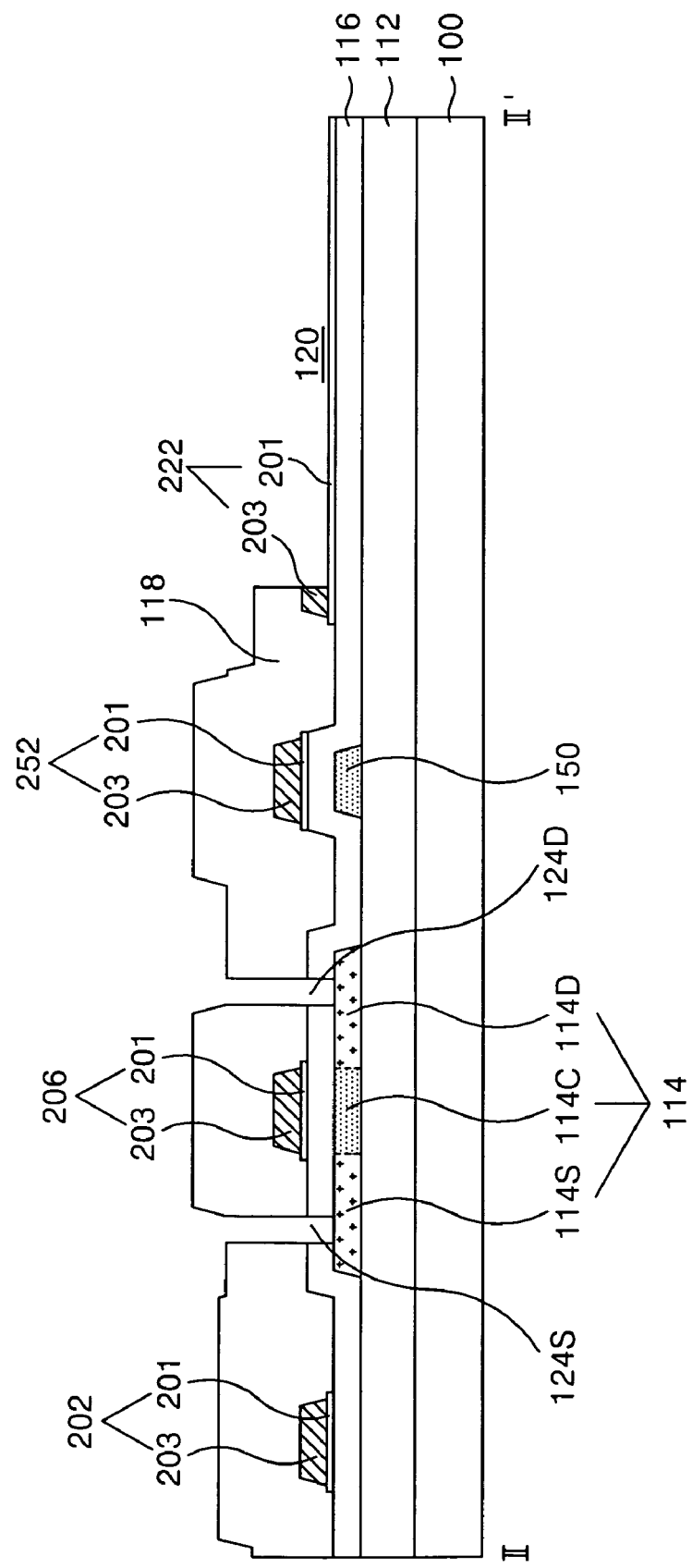

FIGS. 14A and 14B are a plan view and a sectional diagram for explaining a third mask process in the fabricating method of the poly type TFT substrate according to the second embodiment of the present invention.

Referring to FIGS. 14A and 14B, the interlayer insulating film 118 having the source and drain contact holes 124S, 124D and the transmission hole 120 is formed by a third mask process on the gate insulating film 116 where the gate line 202, the gate electrode 206, the storage line 252, and the pixel electrode 222 are formed.

The interlayer insulating film 118 is formed by having the inorganic insulating material such as $SiO_2$ deposited on the entire surface of the gate insulating film 116 where the gate line 202, the gate electrode 206, the storage line 252 and the pixel electrode 222 are formed.

Subsequently, there are formed the source and drain contact holes 124S, 124D which respectively expose the source area 114S and the drain area 114D of the first active layer 114 by penetrating the interlayer insulating film 118 and the gate insulating film 116, and the transmission hole 120 which exposes the pixel electrode 222, by the photolithography process using the third mask and the etching process. Then, the metal layer 203 of the pixel electrode 222 exposed through the transmission hole 120 is etched to expose the transparent conductive layer 201.

Figure 15A:
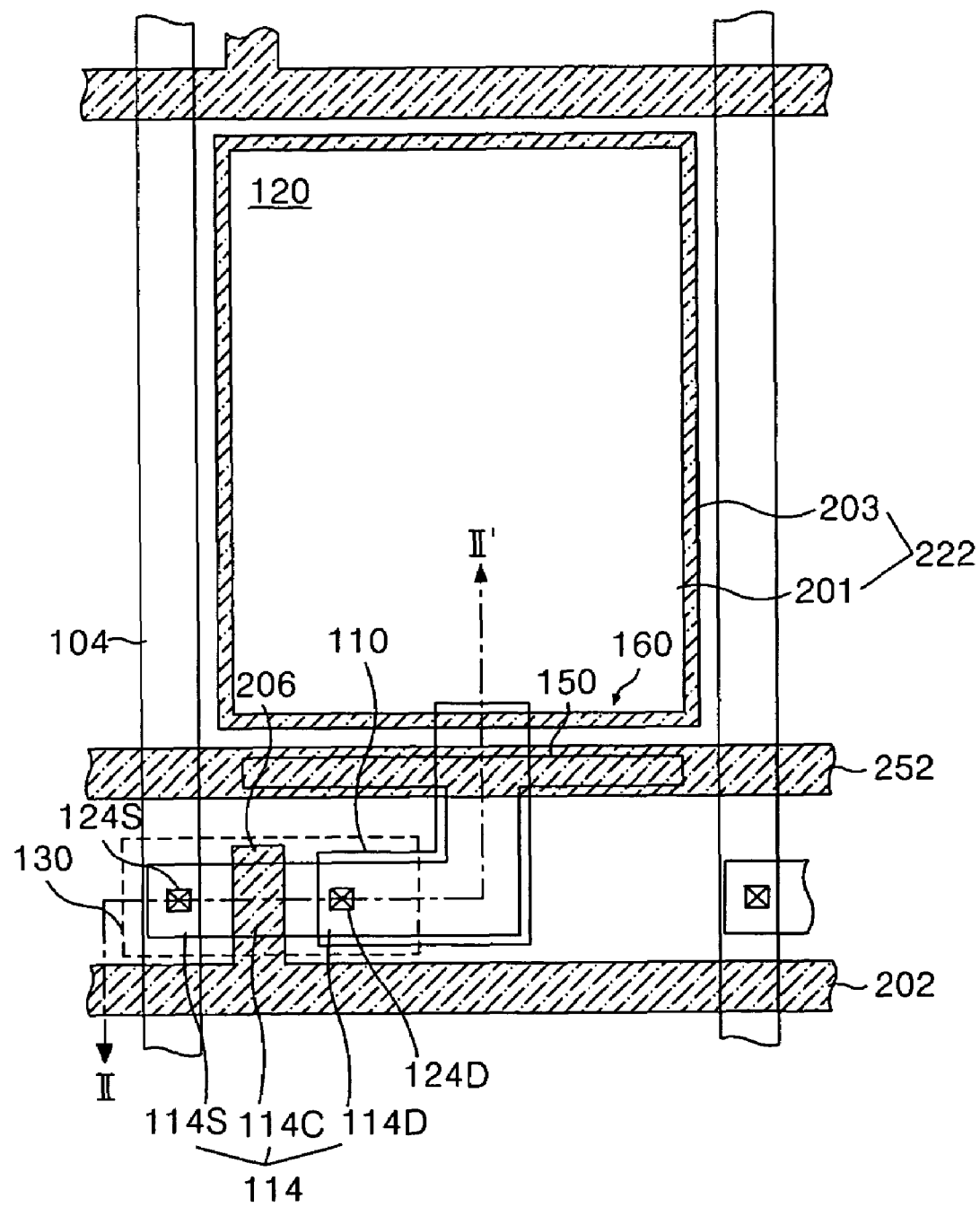
FIGS. 15A and 15B are a plan view and a sectional diagram for explaining a fourth mask process in a fabricating method of the thin film transistor substrate according to the second embodiment of the present invention.
Figure 15B:
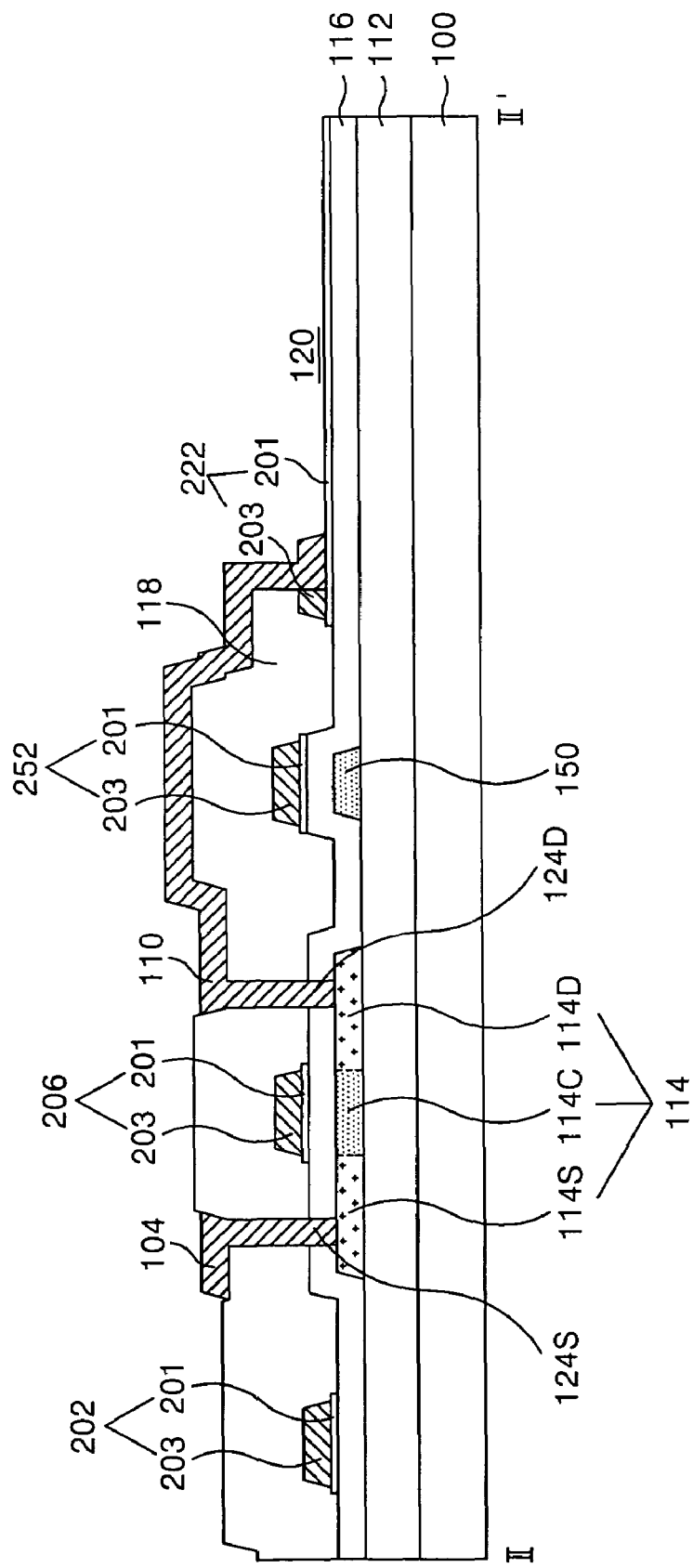

FIGS. 15A and 15B are a plan view and a sectional diagram for explaining a fourth mask process in the fabricating method of the poly type TFT substrate according to the second embodiment of the present invention.

Referring to FIGs. 15A and 15B, the drain electrode 110 and the data line 104 having the source electrode are formed on the interlayer insulating film 118 by a fourth mask process.

The data line 104 having the source electrode and the drain electrode 110 is formed by patterning the source/drain metal layer by the photolithography process using the fourth mask and the etching process after forming the source/drain metal layer on the interlayer insulating film 118. The data line 104 and the drain electrode 110 are respectively connected to the source area 114S and the drain area 114D of the first active layer 114 through the source and drain contact holes 124S, 124D. The drain electrode 110 is extended to cross the storage line 152 so as to be connected to the transparent conductive layer 201 and the metal layer 203 of the pixel electrode 222 which are exposed through the transmission hole 120.

The data line 104 and the drain electrode 110 may be sufficiently protected by an alignment film of an organic insulating material which is formed to be the uppermost layer of the TFT substrate for liquid crystal alignment in the following process.

Figure 16:
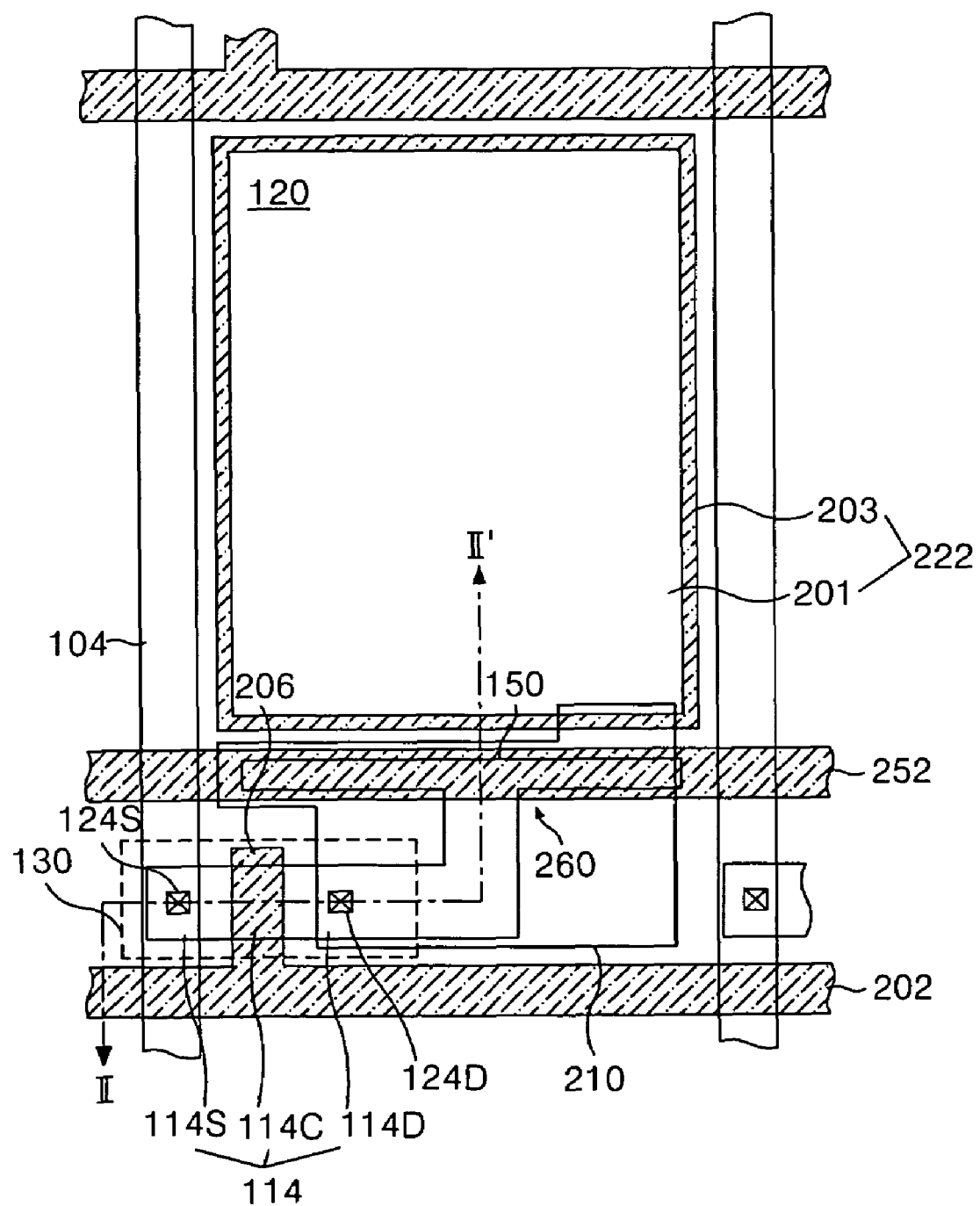
FIG. 16 is a plan view illustrating part of the thin film transistor substrate according to a third embodiment of the present invention.

FIG. 16 is a plan view illustrating part of a poly type TFT substrate according to a third embodiment of the present invention.

The TFT substrate shown in FIG. 16 includes the same components as the TFT substrate shown in FIG. 10, except that the area of the drain electrode 210 is increased so as to increase the overlapping area of the storage line 252 and the drain electrode 210, thus the description for the repeated components will be omitted.

The drain electrode 210 covers the storage line 252 with the interlayer insulating film 118 therebetween and is connected to the pixel electrode 222 through the transmission hole 120. Specifically, an overlapping part of the drain electrode 210 and the storage line 252 is fonned along the storage line 252 to be adjacent to both sides of the data line 104, and the drain electrode is projected inward of the pixel electrode 222 from the overlapping part to be connected to the exposed pixel electrode 222 through the transmission hole. Accordingly, the overlapping area of the drain electrode 210 and the storage line 252 is increased, thereby increasing the capacitance of the storage capacitor 260. Specifically, the storage capacitor 260 is formed in a structure where a first storage capacitor and a second storage capacitor are connected in parallel, wherein the first storage capacitor is formed by having the storage line 252 overlap the second active layer 150 with the gate insulating film 112 in between and the second storage capacitor is formed by having the storage line 252 overlap the drain electrode 210 with the interlayer insulating film 118 in between. Due to the increase of the overlapping area of the storage line 252 and the drain electrode 210, the capacitance of the second storage capacitor is increased, thus the overall capacitance of the storage capacitor 260 being the sum of capacitance of the first and second storage capacitors increases.

ADVANTAGES OF THE INVENTION

As described above, the poly type TFT substrate and the fabricating method thereof according to the present invention forms the pixel electrode along with the gate line, the gate electrode and the storage line which have the double layer structure, thereby simplifying the processes to the four mask processes.

Further, the poly type TFT substrate and the fabricating method thereof according to the present invention patterns the lower transparent conductive layer part by the dry etching method when patterning the transparent conductive layer and the metal layer which constitute the double layer structure, thereby preventing the over-etching of the transparent conductive layer. Accordingly, the under-cut area of the transparent conductive layer is not produced, thus it is possible to prevent the TFT characteristic deterioration and the process defect caused thereby.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising:
    forming a transparent lower conductive layer and an upper conductive layer on a substrate;
    forming a photo-resist pattern on the upper conductive layer;
    patterning the upper conductive layer by using the photo-resist pattern as a mask;
    ashing the photo-resist pattern so as to remain on the upper conductive layer;
    patterning the transparent lower conductive layer by a dry etching method using the patterned upper conductive layer as a mask, wherein the dry etching method does not simultaneously pattern the upper conductive layer; and
    removing the remaining photo-resist pattern.

2. The method according to claim 1, wherein patterning the lower conductive layer includes:
    etching the lower conductive layer in a vertical direction using a linear gas etchant.

3. The method according to claim 2, wherein the etchant includes at least one of HCI, HBr and HI.

4. The method according to claim 1, wherein patterning the lower conductive layer includes:
    patterning the lower conductive layer so that an edge of the patterned lower conductive layer is substantially aligned with an edge of the patterned upper conductive layer or where the lower edge is located outside the upper edge.

5. The method according to claim 1, patterning the upper conductive layer includes wet etching.

6. The method according to claim 1, wherein the photoresist pattern is ashed so that an edge of the photoresist pattern is located inside an edge of the upper conductive layer.

7. A method of fabricating a liquid crystal display device, comprising:
    forming a buffer film on a substrate;
    forming a polysilicon active layer on the buffer film using a first mask;
    forming a gate insulating film on the active layer;
    forming a double conductive layer on the gate insulating film;
    forming a gate line, a gate electrode, and a pixel electrode by patterning the double conductive layer using a second mask so that the line width of a lower conductive layer is equal to or wider than the line width of an upper conductive layer;
    forming an interlayer insulating film on the patterned double conductive layer;
    forming source and drain contact holes exposing source and drain areas of the active layer and a transmission hole exposing the pixel electrode using a third mask; and
    forming a data line cross the gate line and source and drain electrodes connected to the source and drain areas of the active layer on the interlayer insulating film using a fourth mask.

8. The method according to claim 5, wherein patterning the double conductive layer includes:
    forming a photo-resist pattern on the upper conductive layer using the second mask;
    patterning the upper conductive layer by using the photo-resist pattern as a mask;
    ashing the photo-resist pattern on the patterned upper conductive layer;
    patterning the lower conductive layer by a dry etching method using the patterned upper conductive layer as a mask; and
    removing the remaining photo-resist pattern.

9. The method according to claim 6, wherein patterning the lower conductive layer includes:
    etching the lower conductive layer in a vertical direction using a linear gas etchant.

10. The method according to claim 9, wherein the lower conductive layer is a transparent conductive layer, and the etchant includes at least one of HCI, HBr and HI.

11. The method according to claim 7, further comprising:
    forming the storage capacitor connected to the drain electrode,
    wherein forming the storage capacitor includes:
    forming a second active layer extending from the active layer using the first mask; and forming a storage line that overlaps the second active layer with the gate insulating film using the second mask.

12. The method according to claim 11, wherein the storage line is formed of the double conductive layer structure.

13. The method according to claim 11, wherein the transmission hole is formed to penetrate the upper conductive layer of the pixel electrode and the interlayer insulating film.

14. The method according to claim 11, wherein the drain electrode crosses the storage line to connect to the side surface of the upper conductive layer and the surface of the lower conductive layer of the pixel electrode through the transmission hole.

15. The method according to claim 11, wherein forming the storage capacitor further includes:

forming a second storage capacitor by overlapping the drain electrode with the storage line with the interlayer insulating film in between.

16. The method according to claim 15, wherein the drain electrode is formed on the storage line and adjacent to both sides of the data line.

* * * * *